US012743137B2

(12) United States Patent
Withers et al.

(10) Patent No.: US 12,743,137 B2
(45) Date of Patent: Sep. 22, 2026

(54) CIRCUIT MANAGEMENT USING A CIRCUIT MANAGEMENT SERVICE

(71) Applicant: AT&T Intellectual Property I, L.P., Atlanta, GA (US)

(72) Inventors: Kim L. Withers, Helotes, TX (US); Joseph Harten, Long Valley, NJ (US)

(73) Assignee: AT&T Intellectual Property I. L.P., Atlanta, GA (US)

(*) Notice: Subject to any disclaimer, the term of this patent is extended or adjusted under 35 U.S.C. 154(b) by 178 days.

(21) Appl. No.: 18/636,734

(22) Filed: Apr. 16, 2024

(65) Prior Publication Data

US 2025/0321624 A1 Oct. 16, 2025

(51) Int. Cl.
*G06F 1/16* (2006.01)
*H05K 7/14* (2006.01)

(52) U.S. Cl.
CPC ......... *G06F 1/1683* (2013.01); *H05K 7/1498* (2013.01)

(58) Field of Classification Search
None
See application file for complete search history.

(56) References Cited

U.S. PATENT DOCUMENTS 5,394,503 A 2/1995 Dietz, Jr. et al.
5,541,586 A * 7/1996 Wise .................. H04N 21/4382 340/8.1
5,550,755 A * 8/1996 Martin .................. H04H 60/04 348/E5.022
5,764,043 A 6/1998 Czosnowski et al.
6,002,331 A * 12/1999 Laor .................... G02B 6/3807 340/687
6,175,865 B1 1/2001 Dove et al.
6,222,908 B1 4/2001 Bartolutti et al.
6,285,293 B1 9/2001 German et al.
(Continued)

FOREIGN PATENT DOCUMENTS

| | | |
|---|---|---|
| GB | 2347751 | 9/2000 |
| GB | 2375898 | 11/2002 |
| WO | WO2009052381 | 4/2009 |

OTHER PUBLICATIONS

Premium-Line, "Premium-Line 19" Fiber Optic Patch Panel, retrieved at https://premiumline-cabling.com/product/19-fiber-optic-patch-panel/ on Apr. 4, 2024.

(Continued)

*Primary Examiner* — Ranodhi Serrao
(74) *Attorney, Agent, or Firm* — Hartman & Citrin LLC

(57) ABSTRACT

Circuit management using a circuit management service can include sending a request for circuit management data that relates to a circuit associated with an installation site to a circuit management service; receiving the circuit management data, the circuit management data including a circuit identifier and data that identifies a first endpoint device and its location, and a second endpoint device and its location; presenting a user interface that identifies the endpoint devices and their locations with an option to propagate the circuit information to the first endpoint device and to the second endpoint device; and sending a request to the circuit management service to propagate the circuit information to the first endpoint device and to the second endpoint device if the option is selected.

20 Claims, 13 Drawing Sheets

(56) References Cited

U.S. PATENT DOCUMENTS 6,350,148 B1 2/2002 Bartolutti et al.
6,522,737 B1 2/2003 Bartolutti et al.
6,688,910 B1 2/2004 Macauley
6,725,177 B2 4/2004 David et al.
6,871,156 B2 3/2005 Wallace et al.
6,961,675 B2 11/2005 David
7,193,422 B2 3/2007 Velleca et al.
7,217,152 B1 5/2007 Xin et al.
7,297,018 B2 11/2007 Caveney et al.
7,370,106 B2 5/2008 Caveney
7,376,734 B2 5/2008 Caveney
7,468,669 B1 12/2008 Beck et al.
7,488,206 B2 2/2009 Caveney et al.
7,519,000 B2 4/2009 Caveney et al.
7,573,254 B2 8/2009 Cobb et al.
7,613,124 B2 11/2009 Caveney
7,636,050 B2 12/2009 Nordin et al.
7,938,700 B2 5/2011 Jacks et al.
8,128,428 B2 3/2012 Caveney et al.
8,994,547 B2 3/2015 German
9,439,045 B2* 9/2016 Kingsmill ......... H04M 1/72415
9,774,982 B2* 9/2017 Shaw .................... H04W 12/08
9,918,185 B2* 3/2018 Shaw ...................... H04W 4/70
10,374,921 B2 8/2019 German et al.
2002/0062985 A1 5/2002 Rutledge et al.
2003/0073343 A1 4/2003 Belesimo
2005/0266719 A1 12/2005 Pepe
2006/0148279 A1 7/2006 German et al.
2006/0160395 A1 7/2006 Macauley et al.
2007/0117444 A1 5/2007 Caveney et al.
2007/0238343 A1* 10/2007 Velleca ................ H01R 9/2475 439/188
2008/0122579 A1 5/2008 German et al.
2009/0096581 A1 4/2009 Macauley et al.
2012/0128139 A1* 5/2012 Mulla ................. H04M 3/2263 379/93.17
2015/0081904 A1* 3/2015 Guedalia ................. H04L 41/28 709/225
2015/0382244 A1* 12/2015 Lau ....................... H04W 28/22 370/235
2024/0106713 A1* 3/2024 Garvey ................... H04L 41/12

OTHER PUBLICATIONS

VIAVI Solutions, "Data Center Architecture Diagram," retrieved at https://www.viavisolutions.com/sites/default/files/meta-images/datacenter-architecture-diagram.jpg on Apr. 4, 2024.

Colocation America, "What is a Meet Me Room?" retrieved at https://www.colocationamerica.com/data-center-connectivity/meet-me-room on Apr. 4, 2024.

CableWholesale, retrieved at https://files.cablewholesale.com/mailimages/1210-patch.jpg on Apr. 4, 2024.

BigCommerce, retrieved at https://cdn11.bigcommerce.com/s-nnahwwwhci/images/stencil/640w/products/16795/19312/cat6-110-type-patch-panel-48-port-rackmount-56_36870.1663600289.jpg?c=1 on Apr. 4, 2024.

* cited by examiner

CIRCUIT MANAGEMENT USING A CIRCUIT MANAGEMENT SERVICE

BACKGROUND

With the proliferation of networking devices and users, the increasing prevalence of networked locations, and new extension of existing networks and functionality, many facilities and/or other locations may have networking functionality and/or networking facilities. At times, some of these networking facilities may include networking devices and/or networking circuits that were installed months, years, or even decades ago alongside newly-installed equipment. While new and old hardware can coexist in many instances, tracing network connections through what often are twisted webs of networking hardware in multiple rooms and/or areas of buildings can be difficult.

Furthermore, due to deregulation of the telecommunications industry, many devices and/or hardware in user or telecommunications facilities may differ in appearance and/or behavior, and at any rate, these facilities (e.g., networking closets, server rooms, or the like) may not necessarily be installed in a manner that adheres to best practices. For example, installation personnel may encounter misplaced circuits, mislabeled or unlabeled cables, lack of space to install new cables, all available pairs of multipair cables being utilized, and/or other complications.

SUMMARY

The present disclosure is directed to circuit management using a circuit management service. A user or other entity such as an installation technician, a network or device operator, an engineer, or the like, may arrive at an installation site. The user or other entity may install a circuit in a network or portion thereof (e.g., at the installation site), wherein the circuit can include two endpoints, such as the endpoint devices. The user or other entity can interact with a tracking application executed by a user device to create circuit build data. The circuit build data can describe the circuit including a unique circuit identifier, a circuit description that can define functions and/or purposes of the circuit, and endpoint locations that can define at least two locations (to various levels of granularity) associated with the endpoints of the circuit. As explained above, the locations can define, for each endpoint and/or endpoint device, a geographic location, a room or building, a rack (e.g., server rack or the like) or other hardware identifier, a rack unit (within the rack), and a port. The user device can send the circuit build data to a circuit management service, which can store circuit data that defines one or more circuits in a circuit data repository. The circuit data may be keyed on and/or searchable by various aspects of the circuit data such as the circuit identifiers, circuit descriptions, endpoint identifiers, endpoint locations, and the like. It should be understood that this example embodiment is illustrative, and therefore should not be construed as being limiting in any way.

At some time, the user or another entity may come to the installation site to install or activate a circuit. The user or other entity may create a circuit request for requesting information about the circuit from the circuit management service. The circuit request can include authentication information and information about the circuit being installed and/or activated. The circuit management service can search (or query) the circuit data and obtain circuit data associated with the circuit. The circuit management service can generate circuit management data (based on the circuit data) and send the circuit management data to the user device. The user device can display the circuit management data (and/or portions thereof) with an option to propagate the circuit management data to the endpoint devices. In some other embodiments, the circuit management service may respond to the circuit request by sending the circuit management data to the endpoint devices (without a user or other entity requesting propagation of the information). In any event, the circuit management service can propagate the circuit management data to the endpoint devices and the endpoint devices can display circuit information on their respective displays. Thus, a user or other entity can find the appropriate endpoint devices via visual information displayed at the endpoint devices. It should be understood that this example embodiment is illustrative, and therefore should not be construed as being limiting in any way.

According to one aspect of the concepts and technologies disclosed herein, a device is disclosed. The system can include a processor and a memory. The memory can store computer-executable instructions that, when executed by the processor, cause the processor to perform operations. The operations can include sending, by a user device and directed to a circuit management service, a circuit request that can include a request for circuit management data that relates to a circuit associated with an installation site, where the circuit can include a first endpoint device and a second endpoint device. The operations also can include receiving, by the user device and from the circuit management service, the circuit management data, where the circuit management data can include a circuit identifier and data that identifies the first endpoint device and the second endpoint device and location information associated with the first endpoint device and the second endpoint device. The operations also can include presenting, at the user device, a user interface that can include circuit information that identifies the first endpoint device, a first location associated with the first endpoint device, the second endpoint device, a second location associated with the second endpoint device, and an option to propagate the circuit information to the first endpoint device and to the second endpoint device; and in response to detecting selection of the option to propagate the circuit information to the first endpoint device and to the second endpoint device, sending, by the user device, a request to the circuit management service to propagate the circuit information to the first endpoint device and to the second endpoint device.

In some embodiments, the first endpoint device can include a first display, where the first endpoint device can be configured to present a first portion of the circuit information on the first display, the first portion of the circuit information including an identity of the second endpoint device and the second location associated with the second endpoint device. The second endpoint device can include a second display, and the second endpoint device can be configured to present a second portion of the circuit information on the second display, the second portion of the circuit information including an identity of the first endpoint device and the first location associated with the first endpoint device. In some embodiments, the first location can include a first room, a first rack, a first rack unit, and a first port, and the second location can include a second room, a second rack, a second rack unit, and a second port.

In some embodiments, the first portion of the circuit information further can include an owner associated with the circuit and a circuit identifier, and the second portion of the circuit information further can include the owner associated with the circuit and the circuit identifier. In some embodiments, the circuit management service can be hosted by a server computer, and the user device can interact with the circuit management service to create circuit data that describes the circuit when the circuit is created. The circuit management service can generate the circuit management data based on the circuit data.

In some embodiments, the circuit data can include a circuit identifier that can uniquely identify the circuit, a circuit description that can describe a purpose and function of the circuit, and endpoint locations associated with the endpoint devices. In some embodiments, the endpoint locations can include a first geographic location of a first endpoint; a first room in which the first endpoint is located; a first server rack in which the first endpoint is located; a first rack unit in which a first endpoint is located; a first port that corresponds to the first endpoint; a second geographic location of a second endpoint; a second room in which the second endpoint is located; a second server rack in which the second endpoint is located; a second rack unit in which a second endpoint is located; and a second port that corresponds to the second endpoint.

According to another aspect of the concepts and technologies disclosed herein, a method is disclosed. The method can include sending, by a user device including a processor and directed to a circuit management service, a circuit request that can include a request for circuit management data that relates to a circuit associated with an installation site. The circuit can include a first endpoint device and a second endpoint device. The method also can include receiving, by the user device and from the circuit management service, the circuit management data. The circuit management data can include a circuit identifier and data that identifies the first endpoint device and the second endpoint device and location information associated with the first endpoint device and the second endpoint device. The method further can include presenting, at the user device, a user interface that can include circuit information that identifies the first endpoint device, a first location associated with the first endpoint device, the second endpoint device, a second location associated with the second endpoint device, and an option to propagate the circuit information to the first endpoint device and to the second endpoint device. The method also can include in response to detecting selection of the option to propagate the circuit information to the first endpoint device and to the second endpoint device, sending, by the user device, a request to the circuit management service to propagate the circuit information to the first endpoint device and to the second endpoint device.

In some embodiments, the first endpoint device can include a first display, where the first endpoint device can be configured to present a first portion of the circuit information on the first display, the first portion of the circuit information including an identity of the second endpoint device and the second location associated with the second endpoint device. The second endpoint device can include a second display, and the second endpoint device can be configured to present a second portion of the circuit information on the second display, the second portion of the circuit information including an identity of the first endpoint device and the first location associated with the first endpoint device. In some embodiments, the first location can include a first room, a first rack, a first rack unit, and a first port, and the second location can include a second room, a second rack, a second rack unit, and a second port.

In some embodiments, the first portion of the circuit information further can include an owner associated with the circuit and a circuit identifier, and the second portion of the circuit information further can include the owner associated with the circuit and the circuit identifier. In some embodiments, the circuit management service can be hosted by a server computer, and the user device can interact with the circuit management service to create circuit data that describes the circuit when the circuit is created. The circuit management service can generate the circuit management data based on the circuit data.

In some embodiments, the circuit data can include a circuit identifier that can uniquely identify the circuit, a circuit description that can describe a purpose and function of the circuit, and endpoint locations associated with the endpoint devices. In some embodiments, the endpoint locations can include a first geographic location of a first endpoint; a first room in which the first endpoint is located; a first server rack in which the first endpoint is located; a first rack unit in which a first endpoint is located; a first port that corresponds to the first endpoint; a second geographic location of a second endpoint; a second room in which the second endpoint is located; a second server rack in which the second endpoint is located; a second rack unit in which a second endpoint is located; and a second port that corresponds to the second endpoint.

According to yet another aspect of the concepts and technologies disclosed herein, a computer storage medium is disclosed. The computer storage medium can store computer-executable instructions that, when executed by a processor, cause the processor to perform operations. The operations can include sending, by a user device and directed to a circuit management service, a circuit request that can include a request for circuit management data that relates to a circuit associated with an installation site, where the circuit can include a first endpoint device and a second endpoint device. The operations also can include receiving, by the user device and from the circuit management service, the circuit management data, where the circuit management data can include a circuit identifier and data that identifies the first endpoint device and the second endpoint device and location information associated with the first endpoint device and the second endpoint device. The operations also can include presenting, at the user device, a user interface that can include circuit information that identifies the first endpoint device, a first location associated with the first endpoint device, the second endpoint device, a second location associated with the second endpoint device, and an option to propagate the circuit information to the first endpoint device and to the second endpoint device; and in response to detecting selection of the option to propagate the circuit information to the first endpoint device and to the second endpoint device, sending, by the user device, a request to the circuit management service to propagate the circuit information to the first endpoint device and to the second endpoint device.

In some embodiments, the first endpoint device can include a first display, where the first endpoint device can be configured to present a first portion of the circuit information on the first display, the first portion of the circuit information including an identity of the second endpoint device and the second location associated with the second endpoint device. The second endpoint device can include a second display, and the second endpoint device can be configured to present a second portion of the circuit information on the second display, the second portion of the circuit information including an identity of the first endpoint device and the first location associated with the first endpoint device. In some embodiments, the first location can include a first room, a first rack, a first rack unit, and a first port, and the second location can include a second room, a second rack, a second rack unit, and a second port.

In some embodiments, the first portion of the circuit information further can include an owner associated with the circuit and a circuit identifier, and the second portion of the circuit information further can include the owner associated with the circuit and the circuit identifier. In some embodiments, the circuit management service can be hosted by a server computer, and the user device can interact with the circuit management service to create circuit data that describes the circuit when the circuit is created. The circuit management service can generate the circuit management data based on the circuit data.

In some embodiments, the circuit data can include a circuit identifier that can uniquely identify the circuit, a circuit description that can describe a purpose and function of the circuit, and endpoint locations associated with the endpoint devices. In some embodiments, the endpoint locations can include a first geographic location of a first endpoint; a first room in which the first endpoint is located; a first server rack in which the first endpoint is located; a first rack unit in which a first endpoint is located; a first port that corresponds to the first endpoint; a second geographic location of a second endpoint; a second room in which the second endpoint is located; a second server rack in which the second endpoint is located; a second rack unit in which a second endpoint is located; and a second port that corresponds to the second endpoint.

Other systems, methods, and/or computer program products according to embodiments will be or become apparent to one with skill in the art upon review of the following drawings and detailed description. It is intended that all such additional systems, methods, and/or computer program products be included within this description and be within the scope of this disclosure.

DETAILED DESCRIPTION

Figure 1:
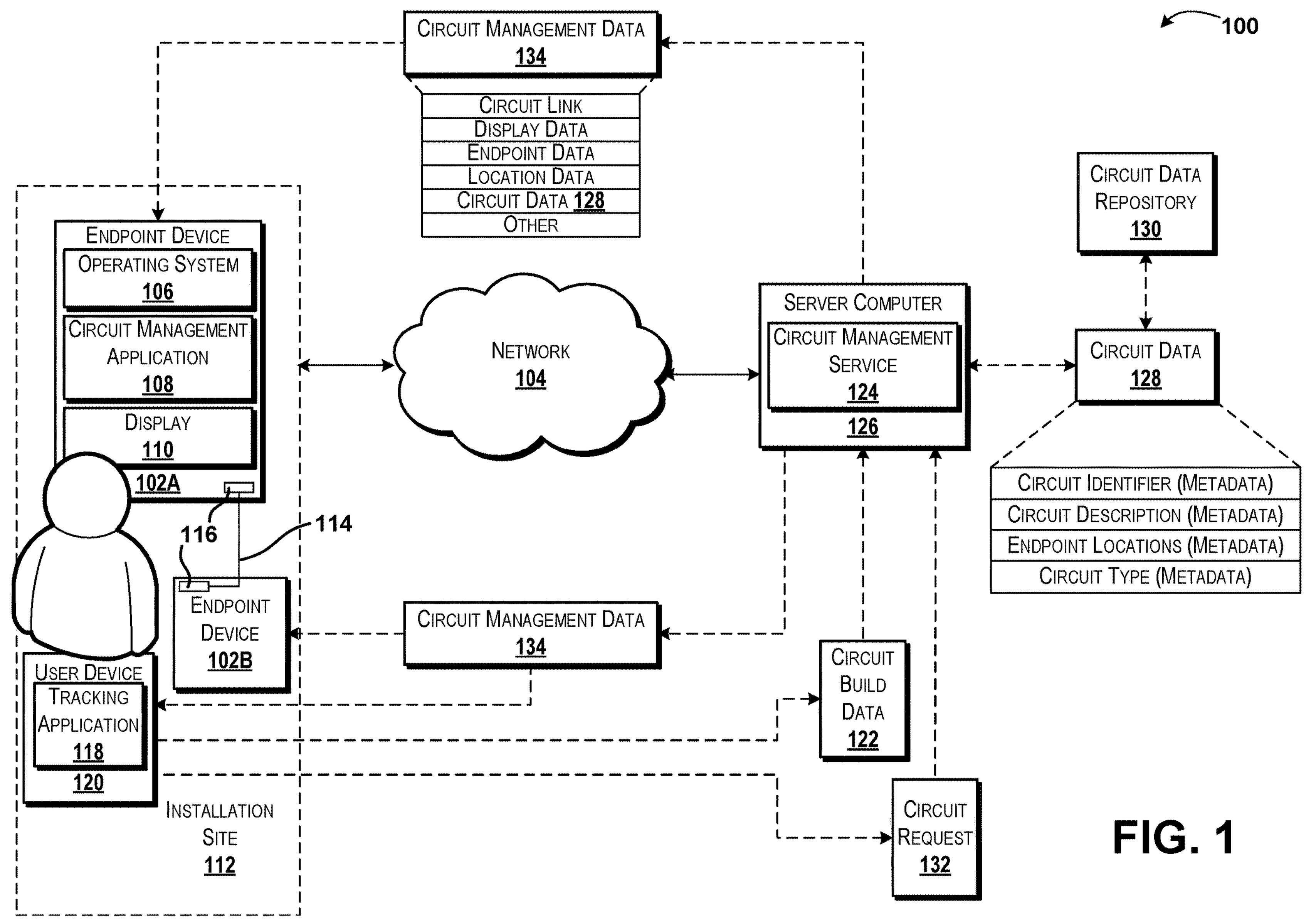
FIG. 1 is a system diagram illustrating an illustrative operating environment for various embodiments of the concepts and technologies described herein.

The following detailed description is directed to circuit management using a circuit management service. A user or other entity such as an installation technician, a network or device operator, an engineer, or the like, may arrive at an installation site. The user or other entity may install a circuit in a network or portion thereof (e.g., at the installation site), wherein the circuit can include two endpoints, such as the endpoint devices. The user or other entity can interact with a tracking application executed by a user device to create circuit build data. The circuit build data can describe the circuit including a unique circuit identifier, a circuit description that can define functions and/or purposes of the circuit, and endpoint locations that can define at least two locations (to various levels of granularity) associated with the endpoints of the circuit. As explained above, the locations can define, for each endpoint and/or endpoint device, a geographic location, a room or building, a rack (e.g., server rack or the like) or other hardware identifier, a rack unit (within the rack), and a port. The user device can send the circuit build data to a circuit management service, which can store circuit data that defines one or more circuits in a circuit data repository. The circuit data may be keyed on and/or searchable by various aspects of the circuit data such as the circuit identifiers, circuit descriptions, endpoint identifiers, endpoint locations, and the like. It should be understood that this example embodiment is illustrative, and therefore should not be construed as being limiting in any way.

At some time, the user or another entity may come to the installation site to install or activate a circuit. The user or other entity may create a circuit request for requesting information about the circuit from the circuit management service. The circuit request can include authentication information and information about the circuit being installed and/or activated. The circuit management service can search (or query) the circuit data and obtain circuit data associated with the circuit. The circuit management service can generate circuit management data (based on the circuit data) and send the circuit management data to the user device. The user device can display the circuit management data (and/or portions thereof) with an option to propagate the circuit management data to the endpoint devices. In some other embodiments, the circuit management service may respond to the circuit request by sending the circuit management data to the endpoint devices (without a user or other entity requesting propagation of the information). In any event, the circuit management service can propagate the circuit management data to the endpoint devices and the endpoint devices can display circuit information on their respective displays. Thus, a user or other entity can find the appropriate endpoint devices via visual information displayed at the endpoint devices. It should be understood that this example embodiment is illustrative, and therefore should not be construed as being limiting in any way.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multiprocessor systems, microprocessor-based or programmable consumer electronics, minicomputers, mainframe computers, and the like.

Referring now to FIG. 1, aspects of an operating environment 100 for various embodiments of the concepts and technologies disclosed herein for circuit management using a circuit management service will be described, according to an illustrative embodiment. The operating environment 100 shown in FIG. 1 includes two or more endpoint devices 102A-B (hereinafter collectively and/or generically referred to as "endpoint device(s) 102"). The endpoint devices 102 can operate in communication with and/or as part of a communications network ("network") 104, though this is not necessarily the case. Although only the components of the endpoint device 102A are illustrated and described in detail with reference to FIG. 1, it should be understood that the endpoint device 102B can be, but is not necessarily, similar and/or even identical to the endpoint device 102A and/or can include the same, similar, or even identical components as illustrated and described with reference to the endpoint device 102A. It should be understood that this example embodiment is illustrative, and therefore should not be construed as being limiting in any way.

According to various embodiments, the functionality of the endpoint devices 102 may be provided by one or more routers, server computers, other computing systems, and the like. It should be understood that the functionality of the endpoint device 102 may be provided by a single device, by two or more similar devices, and/or by two or more dissimilar devices. For purposes of describing the concepts and technologies disclosed herein, the endpoint devices 102 are described herein as custom routing devices, as will be illustrated and described in more detail with reference to FIGS. 2-3. It should be understood that this embodiment is illustrative, and therefore should not be construed as being limiting in any way.

The endpoint device 102 can execute an operating system 106 and one or more application programs such as, for example, a circuit management application 108. The operating system 106 can include a computer program that can control the operation of the endpoint device 102. The circuit management application 108 can include an executable program that can be configured to execute on top of the operating system 106 to provide various functions as illustrated and described herein for providing circuit management. These and other functions of the circuit management application 108 will be described in more detail after the other aspects of the operating environment 100 are disclosed.

As shown in FIG. 1, the endpoint devices 102 also can include a display 110. The display 110 can include a digital display board or screen. In some contemplated embodiments, the display 110 can include a touchscreen and/or multitouch-screen display, though this is not necessarily the case in all embodiments. As will be explained in additional detail below, the display 110 can be configured to output circuit information that may be relevant to establishing circuits, monitoring circuits, modifying circuits, removing circuits, and/or other operations relating to circuits. It should be understood that this example embodiment is illustrative, and therefore should not be construed as being limiting in any way.

According to various embodiments of the concepts and technologies disclosed herein, the endpoint devices 102 can be located at an installation site 112 such as a building, building complex, or the like. In some embodiments, for example, the endpoint device 102A may be located in a first room of a building (e.g., a meet-me-room ("MMR"), a server "closet," or other centralized information technology ("IT") location or room) and the endpoint device 102B may be located in a second room of the building (e.g., another server room, conference room, multipurpose room, office, or the like). It should be understood that the installation site 112 can cover a large geographic area, and need not be limited to one building or one building complex. As such, it should be understood that the above example embodiment is illustrative, and therefore should not be construed as being limiting in any way.

As will be explained in more detail below, the endpoint device 102A can be connected to the endpoint device 102B. In various embodiments of the concepts and technologies disclosed herein, the endpoint devices 102 may be connected via a cable 114, which can connect to respective input/output ports 116 of the endpoint devices 102. It should be understood that this example embodiment is illustrative, and therefore should not be construed as being limiting in any way.

According to various embodiments of the concepts and technologies disclosed herein, a user or other entity (e.g., an installation technician, an engineer, a networking specialist, etc.) can connect the endpoint devices 102. During the connection process and/or at other times, the user or other entity can interact with a tracking application 118 or other executable program, which can be executed by a user device 120 or other device. In various embodiments of the concepts and technologies disclosed herein, the functionality of the user device 120 can be provided by a smartphone, a laptop computer, a tablet computer, or other computing device that can be interacted with by the user. The tracking application 118 can include software for tracing cables or other connection hardware from one room or building to another.

The tracking application 118 can be configured to track, for example, the cable connection and/or setup process by the user or other entity. For example, if the user or other entity connects a cable for a particular connection into a particular port (e.g., Port 1) of a first endpoint device 102A and another particular port (e.g., Port 2) of the second endpoint device 102B, the user can enter this information into the tracking application 118, and the tracking application 118 can be configured to generate circuit build data 122. The tracking application 118 can also be configured to transmit the circuit build data 122 to a circuit management service 124, which can be hosted and/or executed by a server computer 126.

The circuit management service 124 can be configured to receive and analyze the circuit build data 122. The circuit build data 122 that is generated by the tracking application 118 and sent to the server computer 126 can include, inter alia, a circuit identifier, which can include a name or identifier of the circuit such as a circuit identifier, which can be a text string or the like for naming and/or identifying the circuit. The circuit build data 122 also can include a circuit description, which can describe the circuit and/or can include, for example, an intent and/or a purpose associated with the circuit, or the like. The circuit build data 122 also can include endpoint locations, which can include information or data that describes one or more locations of the endpoints associated with the circuit. In various embodiments of the concepts and technologies disclosed herein, the endpoint locations (information) can define, for example, geographic locations associated with the endpoints, buildings in which the endpoints are located, rooms in which the endpoints are located, rack locations (of the two or more endpoints) at which the circuit is located, rack unit locations (of the two or more endpoints) at which the endpoints are located, ports (of the two or more endpoints) that support the circuit, combinations thereof, or the like. The circuit build data 122 also can identify the user (that created the circuit), authorized entities associated with the circuit, companies associated with the circuit (e.g., an Internet service provider ("ISP")) or network operator that supports the circuit, combinations thereof, or the like.

The circuit management service 124 can generate, based on the circuit build data 122, circuit data 128 that defines the circuit installed at the installation site 112. The circuit management service 124 can store the circuit data 128 in a data storage resource or location such as, for example, a circuit data repository 130. The circuit data repository 130 can be a searchable data storage location, thereby enabling circuits to be retrieved from storage on request and/or at other times. According to various embodiments of the concepts and technologies disclosed herein, the functionality of the circuit data repository 130 can be provided, in some embodiments, by one or more databases, server computers, data servers, real or virtual data storage devices, other computing systems, and the like. In the illustrated embodiments, the functionality of the circuit data repository 130 is provided by a data server. It should be understood that this example embodiment is illustrative, and therefore should not be construed as being limiting in any way.

The circuit management service 124 also can be configured to receive, for example from the user device 120 and/or other devices, a circuit request 132. The circuit request 132 can be generated, for example, by the user or other entity installing a circuit at an installation site 112. It should be understood that the circuit request 132 may or may not be requested by the same user that originally generated the circuit build data 122, but FIG. 1 is simplified for ease of description. Rather, a user or other entity at the same or different installation site 112 may know that a particular circuit should be installed, and may create the circuit request 132 to determine if the circuit is stored by and/or accessible to the circuit management service 124 and to obtain data relating the circuit if such data is available. Because the circuit request 132 can be created at additional and/or alternative times and/or can be created for additional and/or alternative reasons, it should be understood that this example embodiment is illustrative, and therefore should not be construed as being limiting in any way.

The circuit management service 124 can be configured to search the circuit data repository 130 (or to send a query to the circuit data repository 130 and/or to trigger other devices to search the circuit data repository) to obtain information associated with the circuit that is being requested. It can be appreciated from the above description that the circuit data repository 130 (and the circuit data 128 stored therein) can be searched by circuit identifier, circuit description, endpoint locations, users, companies, and/or other circuit information included in the circuit build data 122 and/or the circuit data 128. Upon identifying a circuit that matches and/or is responsive to the circuit request 132, the circuit management service 124 can perform operations for retrieving the circuit data 128 from the circuit data repository 130 and generating circuit management data 134.

The circuit management data 134 can include, in some embodiments, the circuit data 128. In some other embodiments, the circuit management data 134 may be the circuit data 128 itself. In any event, the circuit management data 134 also can include, in some embodiments, a circuit link (e.g., a link such as a uniform resource locator ("URL") or uniform resource identifier ("URI")) that can point to a resource that can describe the circuit and/or provide information about the circuit. The circuit link can be used by a recipient of the circuit management data 134 to access the circuit data 128 associated with the circuit. It should be understood that this example embodiment is illustrative, and therefore should not be construed as being limiting in any way.

The circuit management data 134 also can include, in some embodiments, display data. The display data can include renderable data that can be presented by one or more of the endpoint devices 102 for presenting, on the display 110 of the endpoint device(s) 102, information regarding the circuit such as, for example, an owner name, a circuit identifier, a circuit name or purpose, location information (e.g., building, room, rack, rack unit, port, or the like) associated with the circuit and/or another endpoint of the circuit, and the like. Thus, as will be appreciated with additional reference to FIGS. 2-3, the endpoint device(s) 102 can present, on respective displays 110, information relating to the circuit and/or circuit endpoints such as, for example, where the other end of the circuit can be found. Thus, for example, a user located in the vicinity of one of the endpoint devices 102 can know, from information displayed on the display 110 of the one of the endpoint devices 102, where to find the other end of the circuit (e.g., a room, rack, rack unit, port, etc.) where the other end of the circuit is located. It should be understood that this example embodiment is illustrative, and therefore should not be construed as being limiting in any way.

It should be understood that in various embodiments of the concepts and technologies disclosed herein, the circuit management application 108 can be configured to receive the circuit management data 134 and to generate the display data from the circuit management data 134 (e.g., via execution of the circuit management application 108). As such, it should be understood that the display data may or may not be included as such in the circuit management data 134 in all embodiments. It should be understood that this example embodiment is illustrative, and therefore should not be construed as being limiting in any way.

The circuit management data 134 also can include endpoint data. The endpoint data can identify the endpoints associated with a particular circuit. For example, the endpoint data can identify the endpoint devices 102 associated with the circuit. Similarly, the location data can identify locations of the endpoints such as, for example, geographic locations in which one or more of the endpoints are located, buildings in which one or more of the endpoints are located, one or more rooms in which one or more of the endpoints are located, one or more racks in which one or more of the endpoints are located, one or more rack units in which one or more of the endpoints are located, and ports associated with the endpoints. Thus, it can be appreciated that a user with access to the circuit management data 134 can know where to find two or more ports associated with a circuit (e.g., the ports at each of the endpoints). It should be understood that this example embodiment is illustrative, and therefore should not be construed as being limiting in any way. The circuit management data 134 also can include other information such as, for example, authorized entities for the circuits, or the like.

It can be appreciated with reference to FIG. 1 that the circuit management data 134 can be provided by the circuit management service 124 to the endpoint devices 102 associated with the circuit, as well as the user device 120 associated with the user or other entity (e.g., an installation technician). Thus, it can be appreciated that the user device 120 can be configured to present the circuit information via the tracking application 118 rendering some or all of the circuit management data 134. Thus, the user device 120 can present, for the user and/or other entities, the circuit link, the display data, the endpoint data, the location data, the circuit data 128, and/or other information as illustrated and described herein. It should be understood that this example embodiment is illustrative, and therefore should not be construed as being limiting in any way.

Returning now to the various functions of the circuit management application 108, the circuit management application 108 can be configured to obtain the circuit management data 134 and to create a renderable display (e.g., based on the display data and/or based on other information) for display at the display 110 of the endpoint device 102 that executes the circuit management application 108. Thus, the circuit management application 108 can enable a user or other entity to request, e.g., via generating a circuit request 132 at the user device 120 or another device (e.g., via an interface with the endpoint device 102), circuit information for a circuit that is to be installed at the endpoint device 102. The display 110 can present information about the circuit (e.g., what ports of what devices are associated with the circuit, ownership information associated with the circuit, descriptions of the circuit and/or its purpose or function, and the like). This information can be displayed on the display 110 for use by the user and/or other entities. The circuit management application 108 can be configured to generate this renderable display and/or to render the display data that can be included in the circuit management data 134 in some embodiments. It should be understood that this example embodiment is illustrative, and therefore should not be construed as being limiting in any way.

By way of example, a user or other entity may request (via the circuit request 132) a circuit for installation at the installation site 112. The user or other entity may be located at the endpoint device 102A. In response to the circuit request 132, the circuit management service 124 may be configured to obtain circuit data 128 and to provide the circuit data 128 (by itself and/or as part of the circuit management data 134) to the endpoint device 102A, another endpoint device 102B that the circuit management service 124 determines is involved with the circuit, and/or the user device 120. The endpoint device 102A, the endpoint device 102B and/or the user device 120 can render the information to provide guidance and/or other information to the user and/or other entity. Thus, the user and/or other entity can use the displayed information to find endpoints associated with the circuit and/or for other purposes. The user and/or other entity can, in some embodiments, plug a first end of a cable 114 into a port 116 of the endpoint device 102A and a second end of the cable 114 into a port 116 of the endpoint device 102B, thereby establishing the connection between the endpoint devices 102 and thereby installing the circuit. It should be understood that this example embodiment is illustrative, and therefore should not be construed as being limiting in any way.

Although not labeled in FIG. 1, it should be understood that the word "circuit" as recited herein and in the claims can refer to system that can include two endpoint devices 102 and the cable 114 that runs from a first of the two endpoint devices 102 to a second of the endpoint devices 102. It should be understood that this example embodiment is illustrative, and therefore should not be construed as being limiting in any way.

In practice, an installation technician, operator, engineer, user, or other entity may arrive at some point in time at an installation site 112. The user or other entity may install a new circuit in a network or a portion thereof (e.g., at the installation site 112), wherein the circuit can include two endpoints, such as the endpoint devices 102. The user or other entity can interact with a tracking application 118 executed by a user device 120 to create circuit build data 122. The circuit build data 122 can describe the circuit including a unique circuit identifier, a circuit description that can define functions and/or purposes of the circuit, and endpoint locations that can define at least two locations (to various levels of granularity) associated with the endpoints of the circuit. As explained above, the locations can define, for each endpoint and/or endpoint device 102, a geographic location, a room or building, a rack (e.g., server rack or the like) or other hardware identifier, a rack unit (within the rack), and a port. The user device 120 can send the circuit build data 122 to a circuit management service 124, which can store circuit data 128 that defines one or more circuits in a circuit data repository 130. The circuit data 128 may be keyed on and/or searchable by various aspects of the circuit data 128 such as the circuit identifiers, circuit descriptions, endpoint identifiers, endpoint locations, and the like. It should be understood that this example embodiment is illustrative, and therefore should not be construed as being limiting in any way.

At some time, the user or another entity may come to the installation site 112 to install or activate a circuit. The user or other entity may create a circuit request 132 for requesting information about the circuit from the circuit management service 124. The circuit request 132 can include authentication information and information about the circuit being installed and/or activated. The circuit management service 124 can search (or query) the circuit data 128 and obtain circuit data 128 associated with the circuit. The circuit management service 124 can generate circuit management data 134 (based on the circuit data 128) and send the circuit management data 134 to the user device 120. The user device 120 can display the circuit management data 134 (and/or portions thereof) with an option to propagate the circuit management data 134 to the endpoint devices 102. In some other embodiments, the circuit management service 124 may respond to the circuit request 132 by sending the circuit management data 134 to the endpoint devices 102

(without a user or other entity requesting propagation of the information). In any event, the circuit management service 124 can propagate the circuit management data 134 to the endpoint devices 102 and the endpoint devices 102 can display circuit information on their respective displays 110. Thus, a user or other entity can find the appropriate endpoint devices 102 via visual information displayed at the endpoint devices 102. It should be understood that this example embodiment is illustrative, and therefore should not be construed as being limiting in any way.

It should be understood that some embodiments of the concepts and technologies disclosed herein enable users or other entities to send circuit management data 134 to the endpoint devices 102 at other times and/or from other locations and/or devices (and not only from the user device 120 and/or the endpoint devices 102 themselves). Thus, it should be understood that the circuit management service 124 can be configured to send circuit management data 134 to the endpoint devices 102 at any time. It should be understood that this example embodiment is illustrative, and therefore should not be construed as being limiting in any way.

FIG. 1 illustrates two endpoint devices 102, one network 104, one user device 120, one server computer 126, and one circuit data repository 130. It should be understood, however, that various implementations of the operating environment 100 can include one, two, or more than two endpoint device(s) 102; one or more than one network 104; zero, one, or more than one user device 120; zero, one, or more than one server computer 126; and/or zero, one, or more than one circuit data repository 130. As such, the illustrated embodiment should be understood as being illustrative, and should not be construed as being limiting in any way.

Figure 2:
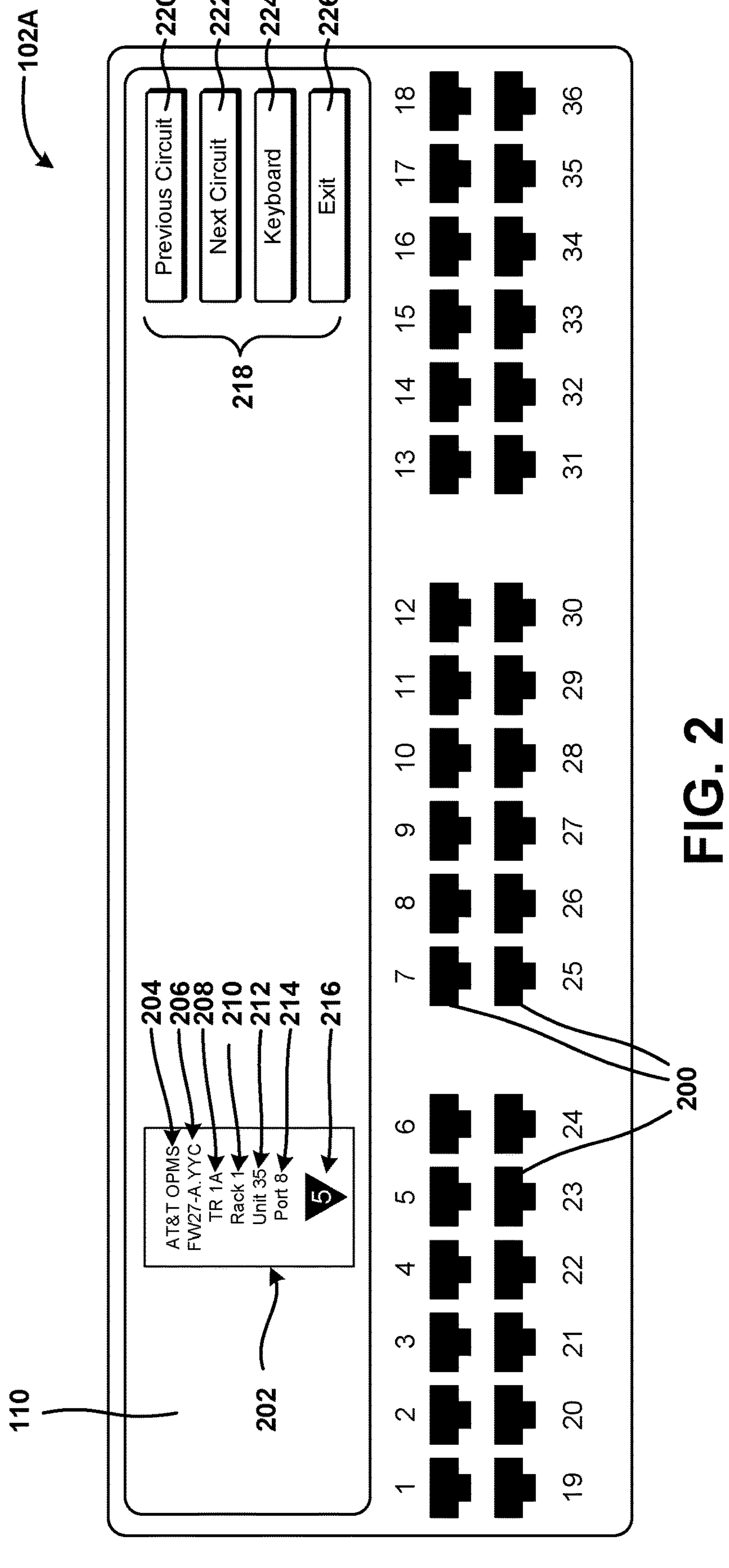
FIG. 2 is a line drawing illustrating an example endpoint device used in association with a circuit management service, according to an illustrative embodiment of the concepts and technologies disclosed herein.
Figure 3A:
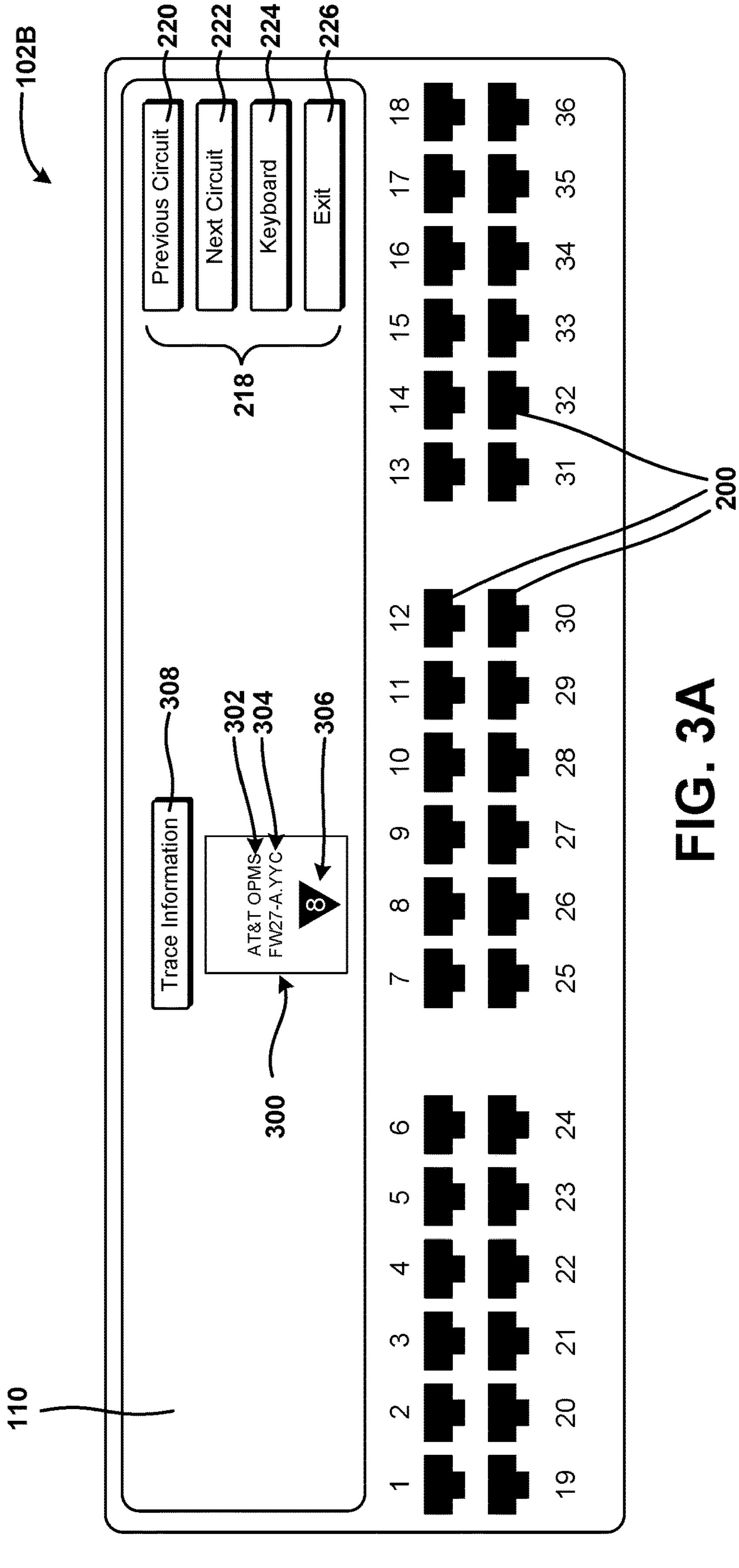
FIGS. 3A-3B are line drawings illustrating an example endpoint device used in association with a circuit management service, according to another illustrative embodiment of the concepts and technologies disclosed herein.
Figure 3B:
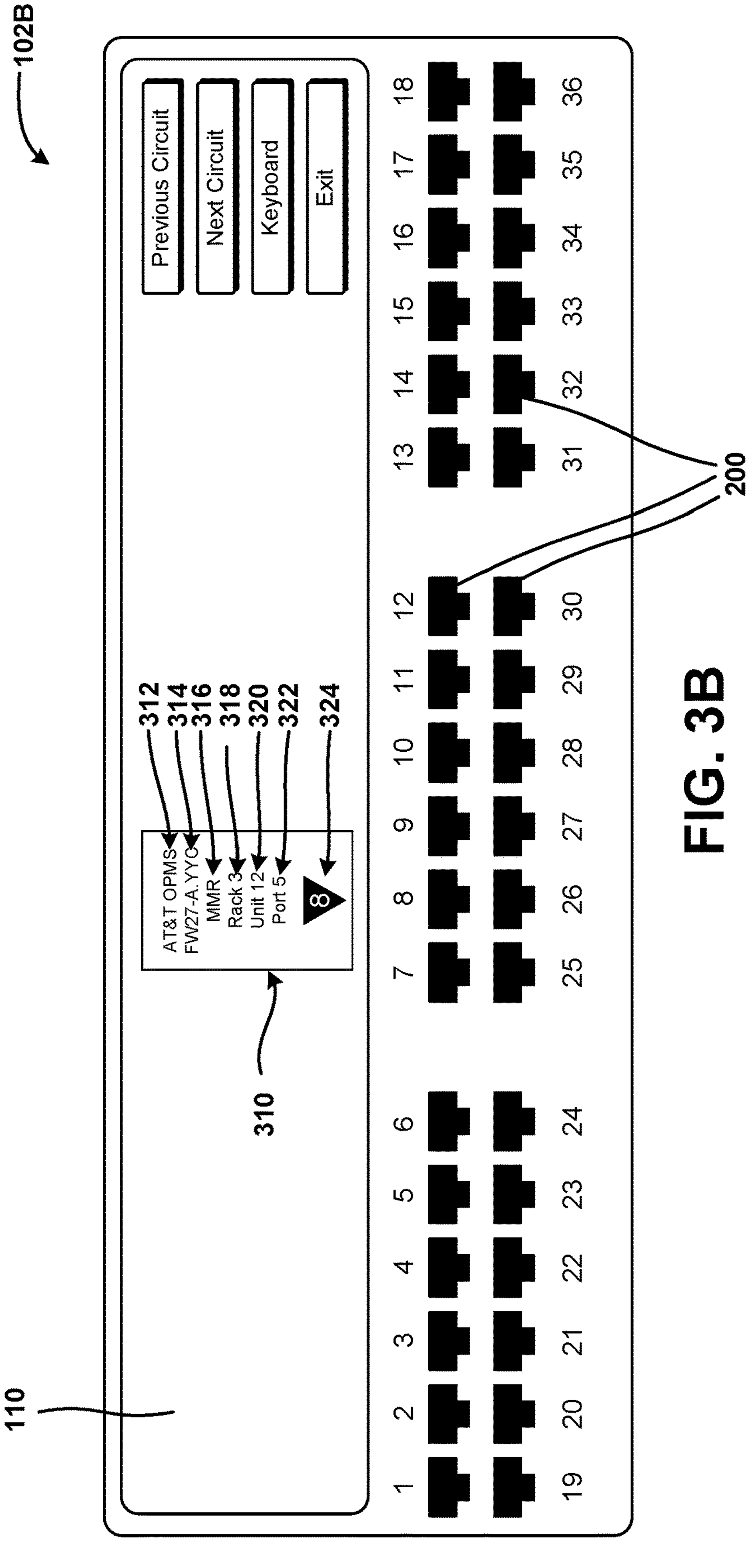

Turning now to FIGS. 2-3B, example endpoint devices 102 will be illustrated and described, according to an example embodiment of the concepts and technologies disclosed herein. In various embodiments, the endpoint devices 102 illustrated in FIGS. 2-3B can be substantially similar to one another and/or can have different features based on needs and/or desires of the operator and/or other entities. As such, while FIG. 2 shows an example endpoint device 102A and FIG. 3B shows an example endpoint device 102B, it should be understood that these embodiments are illustrative and should not be construed as being limiting in any way. In particular, the endpoint device 102A can have and/or include the features shown in FIGS. 3A-3B and/or the endpoint device 102B can have and/or include the features shown in FIG. 2. Additionally, or alternatively, the endpoint devices 102 can both have the same features and/or architecture and/or can have different features and/or architecture than that shown in FIGS. 2 and/or 3A-3B. As such, it should be understood that these example embodiments are illustrative, and therefore should not be construed as being limiting in any way.

Referring first to FIG. 2, the example endpoint device 102A will be described. As can be appreciated with reference to FIG. 2, the endpoint device 102A can include router functionality in some embodiments, and as such, the endpoint device 102A can include one or more input/output ports 200 such as, for example, RJ45 ("ethernet") ports. As is generally understood, the ports 200 can be used to connect the endpoint device 102A to various other devices such as, for example, the endpoint device 102B. Additionally, or alternatively, the endpoint device 102A can include other input/output technologies such as fiber or the like. As such, it should be understood that the illustrated embodiment is merely illustrative of the concepts and technologies disclosed herein and should not be construed as being limiting in any way.

According to various embodiments of the concepts and technologies disclosed herein, the endpoint devices 102 (including the endpoint device 102A) can include the display 110 as shown in FIG. 1. The functionality of the display 110 can be provided by various display technologies such as, for example, various types of hardware such as, for example, a liquid crystal display ("LCD") utilizing any active or passive matrix technology and any backlighting technology (if used). In some embodiments, the display 110 can include an organic light emitting diode ("OLED") display. Other display types such as plasma displays, light emitting diode ("LED") displays, twisted nematic ("TN") displays, in-plane switching ("IPS") displays, vertical alignment ("VA") displays, mini-LED displays, quantum dot ("QLED") displays, quantum-dot OLED ("QD-OLED") displays, microLED displays, and/or other types of displays are contemplated and are possible. In the illustrated embodiment, the display 110 includes a multitouch screen that can support visual output and tactile input, among other things. It should be understood that this example embodiment is illustrative, and therefore should not be construed as being limiting in any way.

As explained above with reference to FIG. 1, according to some example embodiments, the endpoint device 102A can be configured to generate, based on the circuit management data 134, a screen display for presentation on the display 110. As shown in FIG. 2, the screen display on the display 110 can include information associated with the circuit being installed (or already installed) at the endpoint device 102A. In the example embodiment shown in FIG. 2, the screen display on the display 110 can include a circuit information window 202. The circuit information window 202 can include information about a particular circuit.

In the example embodiment shown in FIG. 2, the circuit information window 202 can include, for example, owner or operator information 204 (e.g., a name) associated with the circuit; a circuit identifier 206 that can uniquely identify the circuit; room or facility information 208 that can identify a room, building, facility, or other location of another endpoint of the circuit (i.e., it can be appreciated that the endpoint device 102A can correspond to a first endpoint of the circuit and that another device such as the endpoint device 102B can correspond to the other endpoint of the circuit); rack information 210 that can identify a rack in the room, building, facility, or other location at which the other endpoint is located; rack unit information 212 that can identify a rack unit in the rack at which another endpoint of the circuit is located; and port information 214 that can identify a port (in the rack unit, in the rack, in the room or other facility) at which the other endpoint of the circuit is located. Because additional and/or alternative information for identifying the other endpoint of the circuit are possible and are contemplated, it should be understood that the example information shown in FIG. 2 is merely illustrative and therefore should not be construed as being limiting in any way.

The circuit information window 202 also can include a port indicator 216. In the illustrated embodiment, the port indicator 216 can point to or at the port associated with the circuit being installed (or already installed). In the illustrated embodiment, the port indicator 216 indicates that port number five is associated with the circuit being installed and/or already installed and therefore can indicate, for example to an installation technician or other entity, that a cable 114 associated with the circuit should be plugged into port five. It should be understood that this example embodiment is illustrative, and therefore should not be construed as being limiting in any way.

It also can be understood with reference to FIG. 2 that the circuit information window 202 can inform an entity such as an installation technician, where to find the other endpoint of the circuit associated with the circuit information window 202. In the illustrated embodiment shown in FIG. 2, the circuit information window 202 can indicate, to an installation technician, operator, user, or other entity, that the circuit includes port five of the endpoint device 102A and that the other endpoint of the circuit (e.g., the endpoint device 102B in the illustrated embodiment) is located at port eight of rack unit thirty-five of rack number one in a room or facility known as TR 1A. It should be understood that this example embodiment is illustrative, and therefore should not be construed as being limiting in any way.

As shown in FIG. 2, the display 110 also can present a menu 218. The menu 218 can be used, in some embodiments, to selectively present circuit information (e.g., in the circuit information window 202). It can be appreciated that as a user or other entity advances through the circuits, a circuit associated with the ports 200 labeled 13-18 and/or 31-36 may be associated with the circuits. In such cases, some embodiments of the concepts and technologies disclosed herein include moving the menu 218 to another area of the display 110 to ensure that the circuit information window 202 is not obscured and/or interfered with by the display of the menu 218. It should be understood that this example embodiment is illustrative, and therefore should not be construed as being limiting in any way.

As shown in FIG. 2, the example embodiment of the menu 218 can include a previous circuit navigation button 220, a next circuit navigation button 222, a keyboard option button 224, and an exit option 226. The previous circuit navigation button 220 and next circuit navigation button 222 can be used to go through the circuits associated with the endpoint device 102A. The keyboard option button 224 can be used to cause the endpoint device 102A to display a keyboard on the display 110 (e.g., to enter circuit names, to search by port number, to authenticate with the endpoint device 102A and/or other entities, and/or for additional and/or alternative purposes). The exit option 226 can be used to exit the display of circuit information. Because additional and/or alternative buttons and/or options can be displayed on the display 110 and/or in the menu 218, and because the names and/or identifiers given in the illustrated embodiment are illustrative, it should be understood that this example embodiment is illustrative, and therefore should not be construed as being limiting in any way.

Referring now to FIG. 3A, another endpoint device 102B is illustrated, according to an example embodiment of the concepts and technologies disclosed herein. As can be appreciated in conjunction with FIG. 2, the endpoint device 102B can correspond to another endpoint associated with the circuit associated with the endpoint device 102A. Thus, as shown in FIG. 3A, a circuit connection window 300 is displayed. In the illustrated embodiment, the circuit connection window 300 can include, for example, owner or operator information 302 (e.g., a name) associated with the circuit (which can be the same as the owner or operator information 204 shown in FIG. 2) and a circuit identifier 304 that can uniquely identify the circuit (which can be the same as the circuit identifier 206 shown in FIG. 2). It can be appreciated that the circuit connection window 300 can include additional and/or alternative information and therefore the illustrated embodiment should be understood as being illustrative and should not be construed as being limiting in any way.

The display 110 of the endpoint device 102B also can include a port indicator 306. In the illustrated embodiment, the port indicator 306 can point to or at the port associated with the circuit being installed (or already installed). In the illustrated embodiment, the port indicator 306 indicates that port number eight is associated with the circuit being installed and/or already installed and therefore can indicate, for example to an installation technician or other entity, that a cable 114 associated with the circuit should be plugged into port eight. It can be appreciated that the circuit information window 202 shown in FIG. 2 can indicate the same port 200 illustrated in FIG. 3A. It should be understood that this example embodiment is illustrative, and therefore should not be construed as being limiting in any way.

The display 110 also includes a menu 218, which can be substantially similar to the menu 218 illustrated and described above with reference to FIG. 2. It should be understood that this example embodiment is illustrative, and therefore should not be construed as being limiting in any way. The display 110 also can include a trace information button 308. The trace information button 308 can be selected to cause the endpoint device 102B to display the trace information associated with the circuit (for which information is being displayed in the circuit connection window 300). Thus, it can be appreciated that selection of the trace information button 308 can cause the endpoint device 102B to show information associated with the other endpoint (i.e., the endpoint device 102A shown in FIG. 2 in the example illustrated in FIGS. 2-3B). It should be understood that this example embodiment is illustrative, and therefore should not be construed as being limiting in any way.

Referring now to FIG. 3B, the trace information for the circuit is illustrated, according to an example embodiment of the concepts and technologies disclosed herein. Thus, it can be appreciated that the information on the display 110 as illustrated in FIG. 3B can be presented by the endpoint device 102B in response to a user or other entity selecting the trace information button 308 as shown in FIG. 3A. Because the information shown on the display in FIG. 3B can be presented at additional and/or alternative times, it should be understood that this example embodiment is illustrative, and therefore should not be construed as being limiting in any way.

In FIG. 3B, a trace information window 310 can be presented on the display 110. The trace information window 310 can include, for example, owner or operator information 312 (e.g., a name) associated with the circuit; a circuit identifier 314 that can uniquely identify the circuit; room or facility information 316 that can identify a room, building, facility, or other location of another endpoint of the circuit (i.e., it can be appreciated that the endpoint device 102B can correspond to a second endpoint of the circuit and that another device such as the endpoint device 102A can correspond to the other endpoint of the circuit); rack information 318 that can identify a rack in the room, building, facility, or other location at which the other endpoint is located; rack unit information 320 that can identify a rack unit in the rack at which another endpoint of the circuit is located; and port information 322 that can identify a port (in the rack unit, in the rack, in the room or other facility) at which the other endpoint of the circuit is located. Because additional and/or alternative information for identifying the other endpoint of the circuit are possible and are contemplated, it should be understood that the example information shown in FIG. 3B is merely illustrative and therefore should not be construed as being limiting in any way.

The trace information window 310 also can include a port indicator 324. In the illustrated embodiment, the port indicator 324 can point to or at the port associated with the circuit being installed (or that already has been installed). In the illustrated embodiment, the port indicator 324 indicates that port number eight is associated with the circuit being installed and/or already installed and therefore can indicate, for example to an installation technician or other entity, that a cable 114 associated with the circuit should be plugged into port eight. It can be appreciated that a user or other entity at the endpoint device 102B can determine, by viewing the trace information window 310, where to go to find the other endpoint (in the illustrated embodiment, to the meet-me-room ("MMR"), to rack number three, at rack unit twelve, and at port five). It should be understood that this example embodiment is illustrative, and therefore should not be construed as being limiting in any way.

With collective reference to FIGS. 2-3B, it can be appreciated that a user, technician, or other entity can be located at an installation site 112. The user or other entity can create a circuit request 132 as explained above. The circuit request 132 can specify a circuit being installed and request information regarding endpoints of the circuit. The circuit management service 124 can be configured to receive the circuit request 132 and to identify, by searching or requesting a search of the circuit data repository 130, circuit data 128 relating to the requested circuit. The circuit management service 124 can analyze the circuit data 128 and generate circuit management data 134 that represents (or includes) the circuit data 128 and/or other data relating to the circuit as explained above with reference to FIG. 1.

The circuit management service 124 can be configured to communicate with the endpoints (e.g., the endpoint devices 102) and to provide the circuit management data 134 to the endpoint devices 102 and/or the user device 120 used by the user or other entity. In various embodiments of the concepts and technologies disclosed herein, the endpoint devices 102 can be configured to present, on respective displays of the endpoint devices 102, information relating to the circuit (e.g., a room, rack, rack unit, and port associated with a first endpoint of the circuit; a room, rack, rack unit, and port associated with a second endpoint of the circuit; and/or other information). Of course, the same or other information could be presented on the user device 120 in some embodiments. In any event, this information can be used by the user or other entity to connect the endpoint devices 102 to one another (e.g., via a cable 114 connected to respective input/output ports 116 of the endpoint devices 102). Thus, the display of the circuit management data 134 can help the user or other entity establish and/or activate the circuit. It should be understood that this example embodiment is illustrative, and therefore should not be construed as being limiting in any way.

Figure 3C:
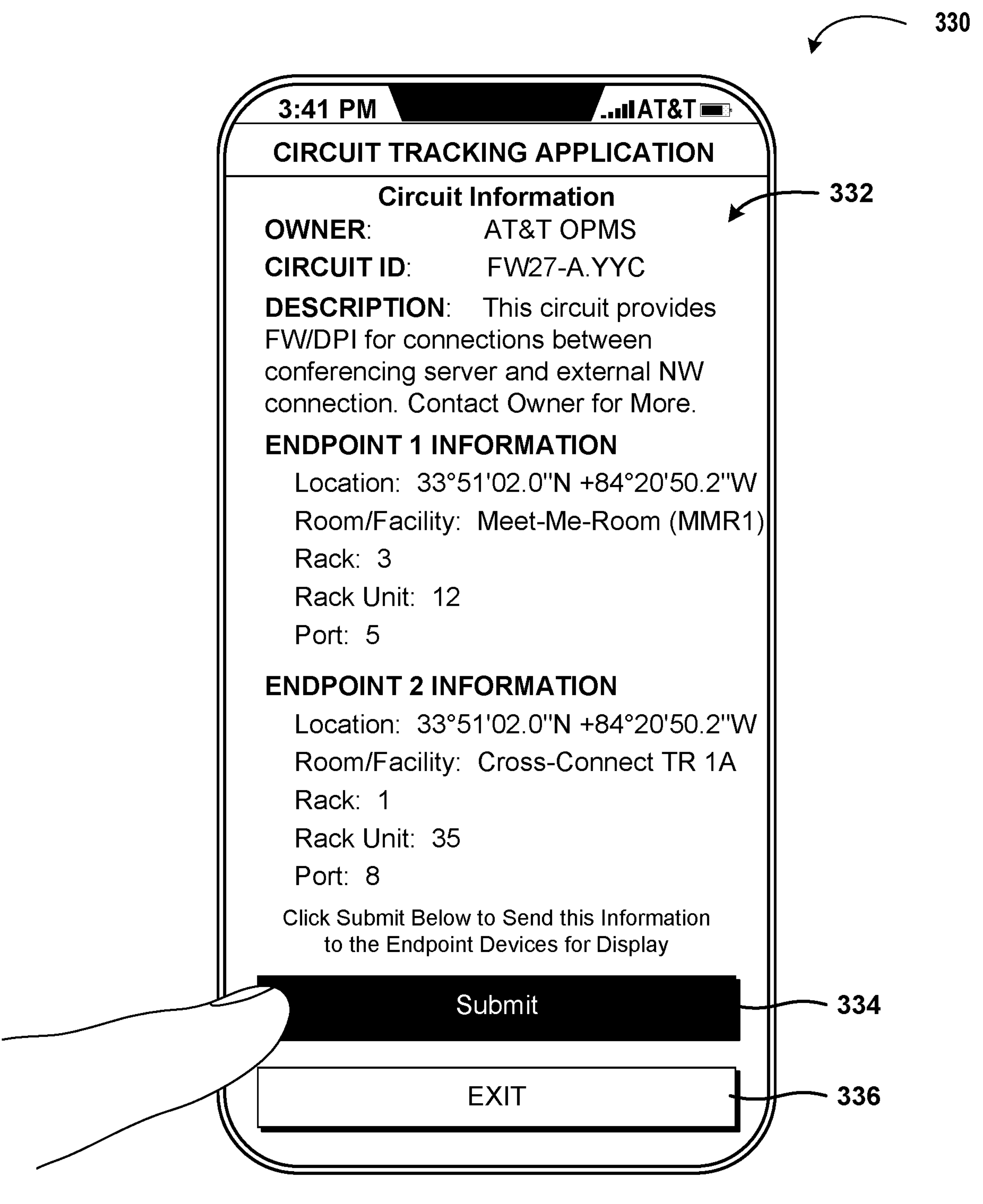
FIG. 3C is a user interface diagram showing a screen display for showing circuit information at a user device, according to one illustrative embodiment of the concepts and technologies described herein.

FIG. 3C is a user interface ("UI") diagram showing aspects of a UI for using and/or interacting with a circuit management service 124 and/or the tracking application 118, according to some illustrative embodiments. FIG. 3C shows an illustrative screen display 330. According to some embodiments of the concepts and technologies described herein, the screen display 330 can be generated by a device such as the user device 120 via interactions with the circuit management service 124 and/or the tracking application 118. In particular, according to various embodiments, the user device 120 can generate the screen display 330 and/or other screen displays in conjunction with and/or based upon interactions with the tracking application 118 described herein, which can be configured to render the screen display 330 using data generated and/or provided by the circuit management service 124 such as, for example, the circuit management data 134 illustrated and described herein. It should be appreciated that the UI diagram illustrated in FIG. 3C is illustrative of one contemplated example of UIs that can be generated and/or displayed in accordance with the concepts and technologies disclosed herein, and therefore should not be construed as being limiting in any way.

According to various embodiments, the screen display 330 can be presented, for example, when a user, technician, operator, or other entity receives circuit management data 134 in response to sending a circuit request 132 to the circuit management service 124. As explained above, the user or other entity may generate the circuit request during installation and/or activation of a circuit and/or at other times. Because the screen display 330 illustrated in FIG. 3C can be displayed at additional and/or alternative times, it should be understood that these examples are illustrative and therefore should not be construed as being limiting in any way.

The screen display 330 can include various menus and/or menu options (not shown in FIG. 3C). The screen display 330 also can include a circuit information window 332. The circuit information window 332 can be configured to present various information relating to a circuit that is being installed and/or activated (e.g., at an installation site 112). The circuit information window 332 can include various types of data and/or information such as, for example, an owner associated with the circuit; a circuit identifier that can uniquely identify the circuit; a description of the circuit (e.g., functionality and/or other information about the circuit); and endpoint information for the circuit. The endpoint information can include, for example, a geolocation associated with a first endpoint; a room/facility associated with the first endpoint, a rack (e.g., a server rack) associated with the first endpoint; a rack unit associated with the first endpoint; a port number associated with the first endpoint; geolocation associated with a second endpoint (although the geolocation associated with the two endpoints in FIG. 3C is the same, it should be understood that this is not necessarily the case); a room/facility associated with the second endpoint, a rack (e.g., a server rack) associated with the second endpoint; a rack unit associated with the second endpoint; and a port number associated with the second endpoint. Because additional and/or alternative circuit information can be included in the circuit information window 332, it should be understood that these example embodiments are illustrative, and therefore should not be construed as being limiting in any way.

The circuit information window 332 also can include a UI control 334 to for sending the circuit information (being displayed in the circuit information window 332) to the endpoints associated with the circuit (e.g., the endpoint devices 102) for display at their respective displays 110. Thus, selection of the UI control 334 can cause the user device 120 to send a command or request to the circuit management service 124 to cause the endpoint devices 102 to display the circuit information (e.g., to prompt the circuit management service 124 and/or other entities to send the circuit management data 134 to the endpoint devices 102 for display on their respective displays). Thus, during installation of the circuit, for example, a user can select the UI control 334 to cause the endpoint devices 102 to display connection information, thereby potentially simplifying connection operations at both endpoints.

The circuit information window 332 also can include a UI control 336 to exit the circuit information window 332. Thus, for example, the user or other entity can select the UI control 336 to cause the user device 102 to close the circuit information window 332 when the desired information has been obtained via the circuit information window 332, to enable the user or other entity to select another or a different circuit, when the user or other entity wishes to close the circuit information window 332 for other reasons, and/or at other times at which the UI control 336 is selected. Because additional or alternative controls can be included in the circuit information window 332, it should be understood that the example embodiment shown in FIG. 3C is illustrative and therefore should not be construed as being limiting in any way.

Figure 4A:
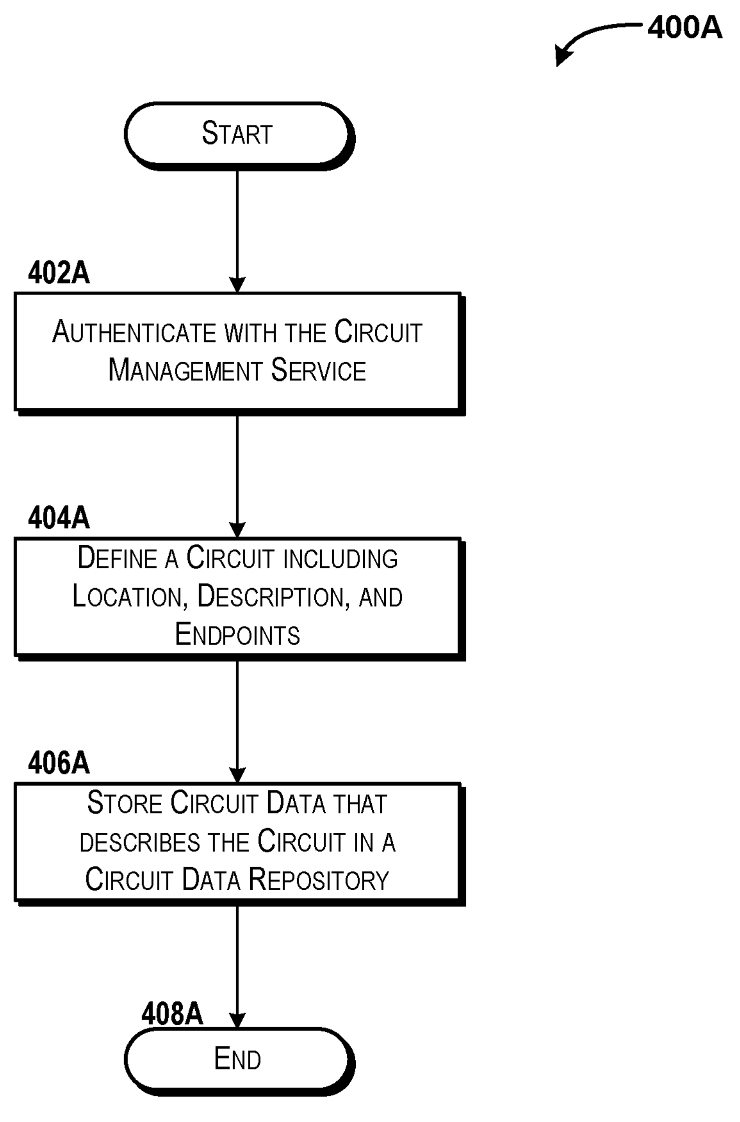
FIG. 4A is a flow diagram showing aspects of a method for creating circuit data using a circuit management service, according to an illustrative embodiment of the concepts and technologies described herein.

Turning now to FIG. 4A, aspects of a method 400A for creating circuit data using a circuit management service 124 will be described in detail, according to an illustrative embodiment. It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the concepts and technologies disclosed herein.

It also should be understood that the methods disclosed herein can be ended at any time and need not be performed in its entirety. Some or all operations of the methods, and/or substantially equivalent operations, can be performed by execution of computer-readable instructions included on a computer storage media, as defined herein. The term "computer-readable instructions," and variants thereof, as used herein, is used expansively to include routines, applications, application modules, program modules, programs, components, data structures, algorithms, and the like. Computer-readable instructions can be implemented on various system configurations including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These states, operations, structural devices, acts, and modules may be implemented in software, in firmware, in special purpose digital logic, and any combination thereof. As used herein, the phrase "cause a processor to perform operations" and variants thereof is used to refer to causing a processor of a computing system or device, such as one of the endpoint devices 102, the server computer 126, and/or other devices, to perform one or more operations and/or causing the processor to direct other components of the computing system or device to perform one or more of the operations.

For purposes of illustrating and describing the concepts of the present disclosure, the method 400A is described herein as being performed by the user device 120 via execution of one or more software modules such as, for example, the tracking application 118. It should be understood that additional and/or alternative devices and/or network nodes can provide the functionality described herein via execution of one or more modules, applications, and/or other software including, but not limited to, the examples listed above. Thus, the illustrated embodiments are illustrative, and therefore should not be viewed as being limiting in any way.

The method 400A begins at operation 402A. At operation 402A, the user device 120 can authenticate with the circuit management service 124. According to various embodiments of the concepts and technologies disclosed herein, the circuit management service 124 can be configured to authenticate a user or device that attempts to connect to the circuit management service 124 (e.g., via a tracking application 118 and/or data generated thereby such as the circuit request 132). As such, the circuit request 132 can be sent with authentication information in some embodiments and/or the server computer 126 can expose an application programming interface ("API") or portal for generating the circuit request 132, wherein a device or user attempting to create the circuit request 132 may be required to authenticate with the circuit management service 124. It should be understood that this example embodiment is illustrative, and therefore should not be construed as being limiting in any way.

According to various embodiments of the concepts and technologies disclosed herein, the circuit request 132 can be generated using a private or public key, sent with login information, encrypted, and/or otherwise protected. In some other embodiments, the server computer 126 and the user device 120 can create a secure channel via which the circuit request 132 is generated and/or transmitted. Because authentication is generally understood, it can be appreciated that other authentication methods and/or processes are possible and are contemplated. As such, the illustrated embodiment is illustrative and therefore should not be construed as being limiting in any way.

From operation 402A, the method 400A can proceed to operation 404A. At operation 404A, the user device 120 can define a circuit including, inter alia, one or more types of location information associated with the circuit (e.g., a geographic location, a room location, a rack location, a rack unit location, a port location, etc.), description of the circuit (e.g., what the circuit is used for, by whom, for whom, and/or other information associated with the circuit), and endpoints of the circuit (e.g., two endpoints associated with the circuit and/or other devices associated with the circuit). Because additional and/or alternative information associated with the circuit can be defined in operation 404A, it should be understood that these example embodiments of circuit information are illustrative, and therefore should not be construed as being limiting in any way.

From operation 404A, the method 400A can proceed to operation 406A. At operation 406A, the user device 120 can store circuit data 128 that describes the circuit (e.g., circuit data 128 that can describe the circuit in accordance with the definitions obtained in operation 404A) in a data storage location such as the circuit data repository 130. According to various embodiments of the concepts and technologies disclosed herein, the circuit data 128 can be keyed on certain data such as, for example, an owner name, a user name, a circuit identifier, endpoints (e.g., endpoint devices 102), purpose, location, or the like. As such, operation 406A can include keying the circuit data 128 and storing the circuit data 128 in the circuit data repository 130 and/or another data storage location. It should be understood that this example embodiment is illustrative, and therefore should not be construed as being limiting in any way.

From operation 406A, the method 400A can proceed to operation 408A. The method 400A can end at operation 408A.

Figure 4B:
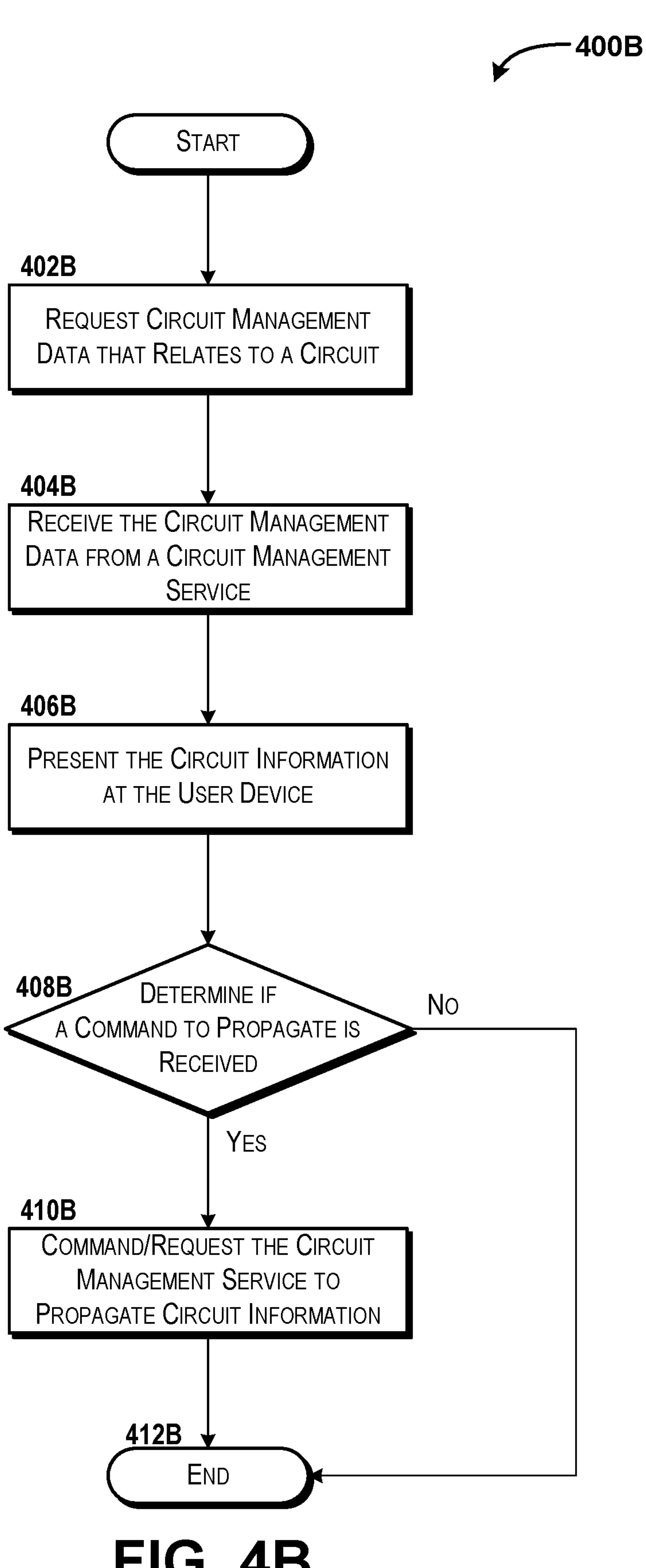
FIG. 4B is a flow diagram showing aspects of a method for obtaining and propagating circuit information, according to an illustrative embodiment of the concepts and technologies described herein.

Turning now to FIG. 4B, aspects of a method 400B for obtaining and/or propagating circuit information will be described in detail, according to an illustrative embodiment. For purposes of illustrating and describing the concepts of the present disclosure, the method 400B is described herein as being performed by the user device 120 via execution of one or more software modules such as, for example, the tracking application 118. It should be understood that additional and/or alternative devices and/or network nodes can provide the functionality described herein via execution of one or more modules, applications, and/or other software including, but not limited to, the examples listed above. Thus, the illustrated embodiments are illustrative, and should not be viewed as being limiting in any way.

It can be appreciated that before the illustrated portion of the method 400B begins, the user device 120 can authenticate with the circuit management service 124. As noted above, the circuit management service 124 can be configured to authenticate a user or device that attempts to connect to the circuit management service 124, so authentication can occur at any time. As noted above, the user device 120 can be configured to send authentication information with requests (e.g., the circuit request 132), authenticate with the circuit management service 124 via an API or portal for generating commands and/or requests, via interactions with an authentication server, and/or in other manners. Because authentication can be accomplished in additional and/or alternative manners, it should be understood that these example embodiments are illustrative, and therefore should not be construed as being limiting in any way.

The method 400B begins at operation 402B. At operation 402B, the user device 120 can request circuit management data 134 that relates to a circuit (e.g., a particular circuit being activated and/or installed at an installation site 112). Thus, operation 402B can correspond to the user device 120 generating a circuit request 132 in some embodiments. In any event, the user or other entity can identify a circuit being requested by name, circuit identifier, one or more types of location information associated with the circuit (e.g., a geographic location, a room location, a rack location, a rack unit location, a port location, etc.), description of the circuit (e.g., what the circuit is used for, by whom the circuit is used, the circuit purpose and/or function, for whom the circuit is used for, and/or other information associated with the circuit), endpoints of the circuit (e.g., two endpoints associated with the circuit and/or other devices associated with the circuit), and/or in other manners and request that circuit in operation 402B. Because the circuit management data 134 can be requested in additional and/or alternative manners, it should be understood that this example embodiment is illustrative, and therefore should not be construed as being limiting in any way.

From operation 402B, the method 400B can proceed to operation 404B. At operation 404B, the user device 120 can receive, from the circuit management service 124, the circuit management data 134 that relates to the circuit as requested in operation 402B. From operation 404B, the method 400B can proceed to operation 406B. At operation 406B, the user device 120 can present circuit information (e.g., extracted from the circuit management data 134 received in operation 404B) at the user device 120. According to various embodiments of the concepts and technologies disclosed herein, the user device 120 can present the circuit information on a display of the user device 120. As was shown in FIG. 3C, the user device 120 can display the circuit information with an option to propagate the information to one or more of the endpoint devices 102, thought this is not necessarily the case in all embodiments. Thus, it should be understood that this example embodiment is illustrative, and therefore should not be construed as being limiting in any way.

From operation 406B, the method 400B can proceed to operation 408B. At operation 408B, the user device 120 can determine if a command to propagate the circuit information has been received. Thus, operation 408B can correspond to the user device 120 determining if a user or other entity has requested that the circuit management data 134 be sent to the endpoints (e.g., the endpoint devices 102) for display. It can be appreciated from the illustration and description herein that such a request may be made, for example, when a user or other entity is installing and/or activating a circuit (e.g., to simplify installation for an installation technician or the like). Because this command can be received at additional and/or alternative times, it should be understood that this example embodiment is illustrative, and therefore should not be construed as being limiting in any way.

If the user device 120 determines, in operation 408B, that the command to propagate the circuit information has been received, the method 400B can proceed to operation 410B. At operation 410B, the user device 120 can generate a command and/or request for the circuit management service 124 to send the circuit information (e.g., the circuit management data 134) to one or more devices (e.g., the endpoint devices 102). As illustrated and described herein, the endpoint devices 102 can display the circuit information on respective displays 110 of the endpoint devices 102, according to various embodiments of the concepts and technologies disclosed herein. It should be understood that this example embodiment is illustrative, and therefore should not be construed as being limiting in any way.

From operation 410B, the method 400B can proceed to operation 412B. The method 400B also can proceed to operation 412B if the user device 120 determines, in operation 408B, that the command to propagate the circuit information has not been received. The method 400B can end at operation 412B.

Figure 5:
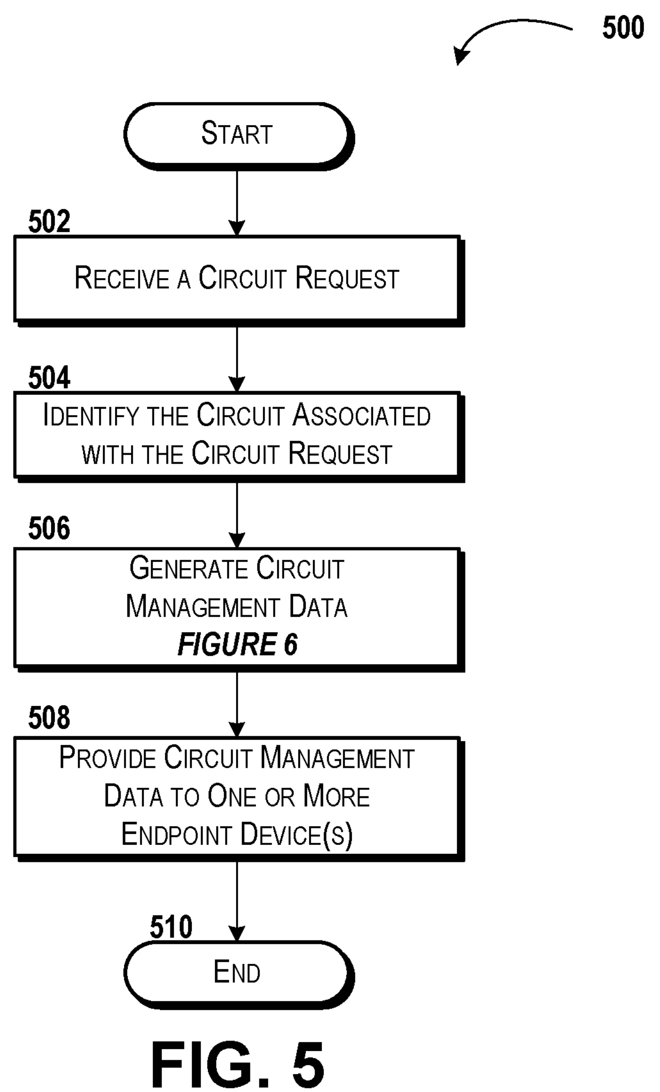
FIG. 5 is a flow diagram showing aspects of a method for generating and providing circuit management data to endpoint devices, according to an illustrative embodiment of the concepts and technologies described herein.

Turning now to FIG. 5, aspects of a method 500 for generating and providing circuit management data 134 to endpoint devices 102 will be described in detail, according to an illustrative embodiment. For purposes of illustrating and describing the concepts of the present disclosure, the method 500 is described herein as being performed by the server computer 126 via execution of one or more software modules such as, for example, the circuit management service 124. It should be understood that additional and/or alternative devices and/or network nodes can provide the functionality described herein via execution of one or more modules, applications, and/or other software including, but not limited to, the circuit management service 124. Thus, the illustrated embodiments are illustrative, and should not be viewed as being limiting in any way.

The method 500 begins at operation 502. At operation 502, the server computer 126 can receive a circuit request 132. It can be appreciated with reference to FIG. 1 that in various embodiments, the circuit request 132 can include authentication information, an indication of what circuit is being requested (e.g., by name, by owner, by circuit identifier, by purpose, by endpoint(s), or the like), a requestor (e.g., an entity or device such as, for example, the endpoint devices 102, the user device 120, or the like), and one or more endpoint device(s) 102 that are to be included in the circuit being requested. In various embodiments of the concepts and technologies disclosed herein, the circuit request 132 can be received from the user device 120, one or more of the endpoint devices 102, and/or other devices. Because additional and/or alternative information can be included in the circuit request 132, it should be understood that the above examples are illustrative, and therefore should not be construed as being limiting in any way.

From operation 502, the method 500 can proceed to operation 504. At operation 504, the server computer 126 can identify the circuit associated with the circuit request received in operation 502. It can be appreciated that operation 504 can correspond to the server computer 126 analyzing the circuit request 132 received (or otherwise obtained) in operation 502 to determine, based on explicitly or implicitly included information, what circuit is being requested. It can be appreciated that the circuit may be identified by name, by owner or operator, by endpoint(s), by purpose, and/or other information. It should be understood that this example embodiment is illustrative, and therefore should not be construed as being limiting in any way.

From operation 504, the method 500 can proceed to operation 506. At operation 506, the server computer 126 can generate an instance of circuit management data 134. The circuit management data 134 generated in operation 506 can include, for example, a circuit link (e.g., a URL or URI that can link to information about the circuit); display data that can represent circuit information and/or other graphical display data; endpoint data that may identify the endpoints associated with the circuit; location data, which may identify geographic locations, building locations, room locations, rack locations, rack unit locations, port locations, and/or other location information for identifying where the circuit and/or its endpoints are located; circuit data 128; other information; combinations thereof; or the like. As explained above, the circuit management data 134 can be based on the circuit data 128, which can include circuit identifiers, circuit descriptions, endpoint locations, and additional and/or alternative forms of metadata that can describe the circuits. Additional details of generating the circuit management data 134 will be illustrated and described in more detail below with reference to FIG. 6. It should be understood that this example embodiment is illustrative, and therefore should not be construed as being limiting in any way.

From operation 506, the method 500 can proceed to operation 508. At operation 508, the server computer 126 can provide the circuit management data 134 generated in operation 506 to one or more endpoint device(s) 102 that are to host the circuit and/or a portion thereof. In various embodiments of the concepts and technologies disclosed herein, the user device 120 and/or other device that generates the circuit request 132 can identify one or more of the endpoint devices 102, while in some other embodiments, the endpoint devices 102 can be identified based on the circuit data 128, the circuit request 132, and/or other information. Regardless of how the endpoint devices 102 are identified, operation 508 can include providing the circuit management data 134 to one or more of the endpoint devices 102. It should be understood that this example embodiment is illustrative, and therefore should not be construed as being limiting in any way.

From operation 508, the method 500 can proceed to operation 510. The method 500 can end at operation 510.

Figure 6:
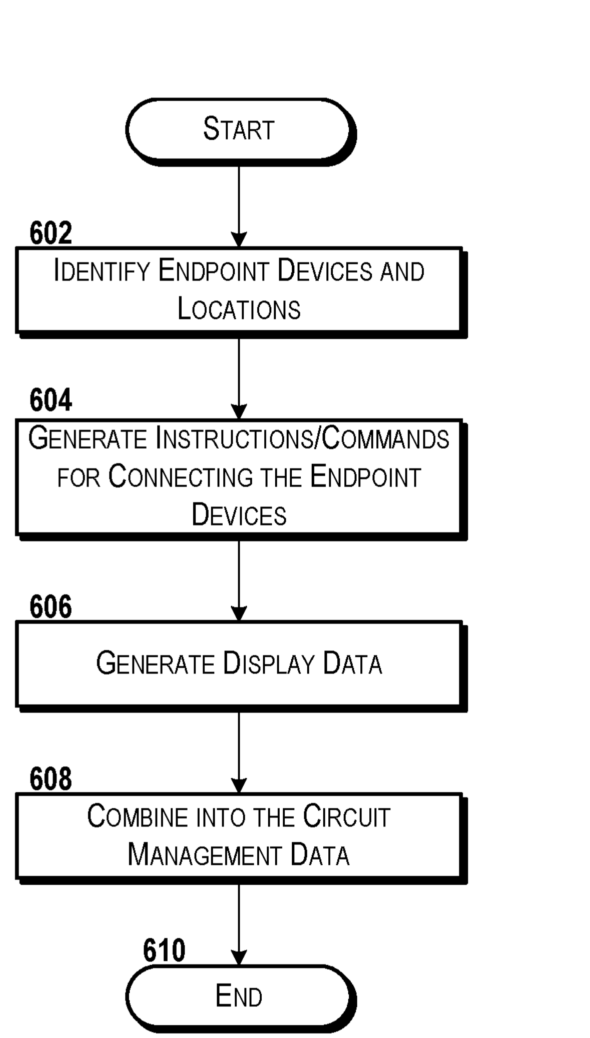
FIG. 6 is a flow diagram showing aspects of a method for generating circuit management data using a circuit management service, according to an illustrative embodiment of the concepts and technologies described herein.

Turning now to FIG. 6, aspects of a method 600 for generating circuit management data 134 using a circuit management service 124 will be described in detail, according to an illustrative embodiment. For purposes of illustrating and describing the concepts of the present disclosure, the method 600 is described herein as being performed by the server computer 126 via execution of one or more software modules such as, for example, the circuit management service 124. It should be understood that additional and/or alternative devices and/or network nodes can provide the functionality described herein via execution of one or more modules, applications, and/or other software including, but not limited to, the circuit management service 124. Thus, the illustrated embodiments are illustrative, and should not be viewed as being limiting in any way.

The method 600 begins at operation 602 (and can be preceded by operation 504 of the method 500 shown in FIG. 5). At operation 602, the server computer 126 can identify (for the circuit identified in operation 504 of the method 500 shown in FIG. 5) the endpoint devices 102 associated with a circuit and one or more locations associated with the endpoint devices 102. As explained herein, the locations of the endpoint devices 102 can be defined in terms of geographic locations (e.g., a city, town, building or the like at which one of the endpoint devices 102 is located; a room, building, or other facility at which one of the endpoint devices 102 is located at the geographic location; a rack associated with the circuit, the rack being located in the room, building, or other facility at the geographic location; a rack unit associated with the circuit and where the rack unit is located within the rack; a port associated with the circuit and where the port is located within the rack unit (within the rack, within the room, building or other facility, and at the geographic location)). As such, operation 602 can include locating the devices and their respective locations. It should be understood that this example embodiment is illustrative, and therefore should not be construed as being limiting in any way.

From operation 602, the method 600 can proceed to operation 604. At operation 604, the server computer 126 can generate instructions and/or commands for connecting the endpoint devices 102 identified in operation 602. The instructions can identify, for example, the two endpoint devices 102; the geographic locations of the two endpoint devices 102; the room, building, or facility location within the geographic location at which one or more of the endpoint devices 102 are located; a rack associated with the circuit, the rack being located in the room, building, or other facility at the geographic location; a rack unit associated with the circuit, where the rack unit is located within the rack; and/or a port associated with the circuit, where the port is located within the rack unit (within the rack, within the room, building or other facility, and at the geographic location). The instructions and/or commands also can define, for a particular circuit, how the endpoint devices 102 are to be connected (e.g., a type of cable or wire or the like), a label that exists on the cable or wire or the like; and/or other information that can be used by an installation technician, user, or other entity to create the circuit. It should be understood that this example embodiment is illustrative, and therefore should not be construed as being limiting in any way.

From operation 604, the method 600 can proceed to operation 606. At operation 606, the server computer 126 can generate display data for presentation at one or more of the endpoint devices 102 identified in operation 602. The display data can include renderable data that, when rendered, will show the instructions, the owner and/or operator information, user information, circuit identifier information, user identification information, a building, a room, a rack, a rack unit, a port, a purpose of the circuit, and/or other information that can describe the circuit and/or enable a user or other entity to create the circuit at the installation site 112. It should be understood that this example embodiment is illustrative, and therefore should not be construed as being limiting in any way.

From operation 606, the method 600 can proceed to operation 608. At operation 608, the server computer 126 can combine the data identified and/or generated in operations 602-606 into the circuit management data 134. From operation 608, the method 600 can proceed to operation 610. The method 600 can end at operation 610.

Figure 7:
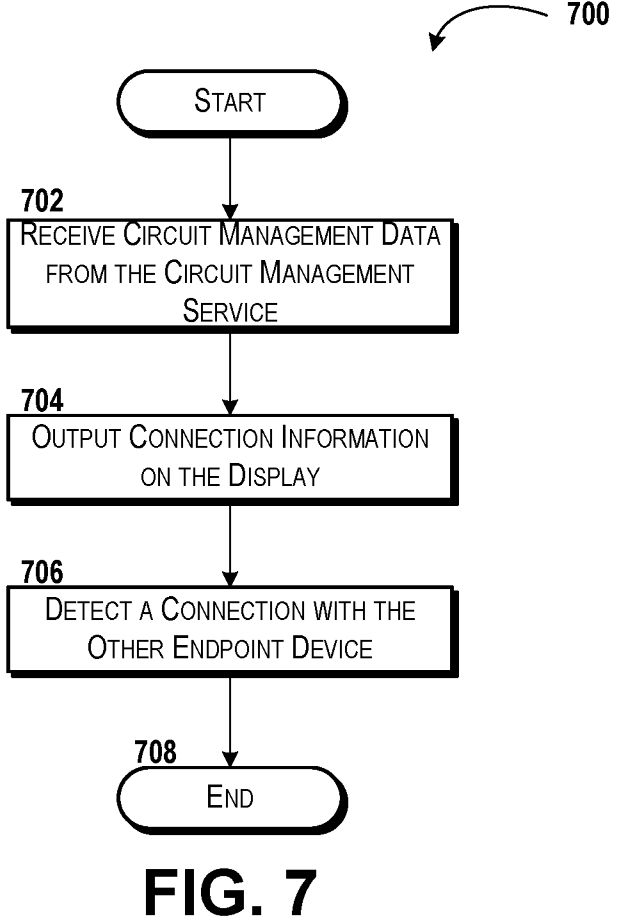
FIG. 7 is a flow diagram showing aspects of a method for obtaining and outputting connection information at an endpoint device, according to an illustrative embodiment of the concepts and technologies described herein.

Turning now to FIG. 7, aspects of a method 700 for obtaining and outputting connection information at an endpoint device 102 will be described in detail, according to an illustrative embodiment. For purposes of illustrating and describing the concepts of the present disclosure, the method 700 is described herein as being performed by the endpoint device 102 via execution of one or more software modules such as, for example, the circuit management application 108. It should be understood that additional and/or alternative devices and/or network nodes can provide the functionality described herein via execution of one or more modules, applications, and/or other software including, but not limited to, the circuit management application 108. Thus, the illustrated embodiments are illustrative, and should not be viewed as being limiting in any way.

The method 700 begins at operation 702. Although not shown in FIG. 7, it should be understood that prior to the execution of operation 702, a user device 120 can generate and provide a circuit request 132 to the circuit management service 124 to request a particular certificate. It should be understood that this example embodiment is illustrative, and therefore should not be construed as being limiting in any way. At operation 702, the endpoint device 102 can receive circuit management data 134 from the circuit management service 124.

According to various embodiments of the concepts and technologies disclosed herein, the circuit management service 124 can be configured to identify the endpoint devices 102 and to provide (e.g., to send and/or to trigger other devices to send) the circuit management data 134 to the endpoint devices 102. It should be understood that this example embodiment is illustrative, and therefore should not be construed as being limiting in any way.

From operation 702, the method 700 can proceed to operation 704. At operation 704, the endpoint device 102 can output connection information on the display 110 of the endpoint device 102. Examples of this are shown in FIGS. 2-3B, and it can be appreciated that the output connection information can include location information such as, for example, a geographic location associated with one of the endpoint devices 102; a building, room, or facility at the geographic location that is associated with one of the endpoint devices 102; a rack at the building, room, or facility that is associated with one of the endpoint devices 102; a rack unit of the rack that is associated with one of the endpoint devices 102; a port of the rack unit that is associated with the circuit; and/or other information that can identify the endpoint devices 102. The output connection information also can include owner information, user information, operator information, purpose information, circuit identifiers, connection instructions, combinations thereof, or the like. Thus, in operation 704, the endpoint device 102 can output all the information needed for a user or other entity to install the circuit and/or to trace the circuit to its other endpoint (e.g., in another room, rack, rack unit, port, building, facility, geographic location, etc.). It should be understood that this example embodiment is illustrative, and therefore should not be construed as being limiting in any way.

From operation 704, the method 700 can proceed to operation 706. At operation 706, the endpoint device 102 can detect a connection to the other endpoint device 102. In operation 706, the endpoint device 102 can determine that the circuit has been established (e.g., by detecting communications with the other endpoint device 102). Thus, operation 706 can correspond to the endpoint device 102 determining that the circuit has been installed. Although not separately shown in FIG. 7, the endpoint device 102 can be configured to stop displaying information on the display 110 once the circuit is established and/or to perform other operations. It should be understood that this example embodiment is illustrative, and therefore should not be construed as being limiting in any way.

From operation 706, the method 700 can proceed to operation 708. The method 700 can end at operation 708.

Figure 8:
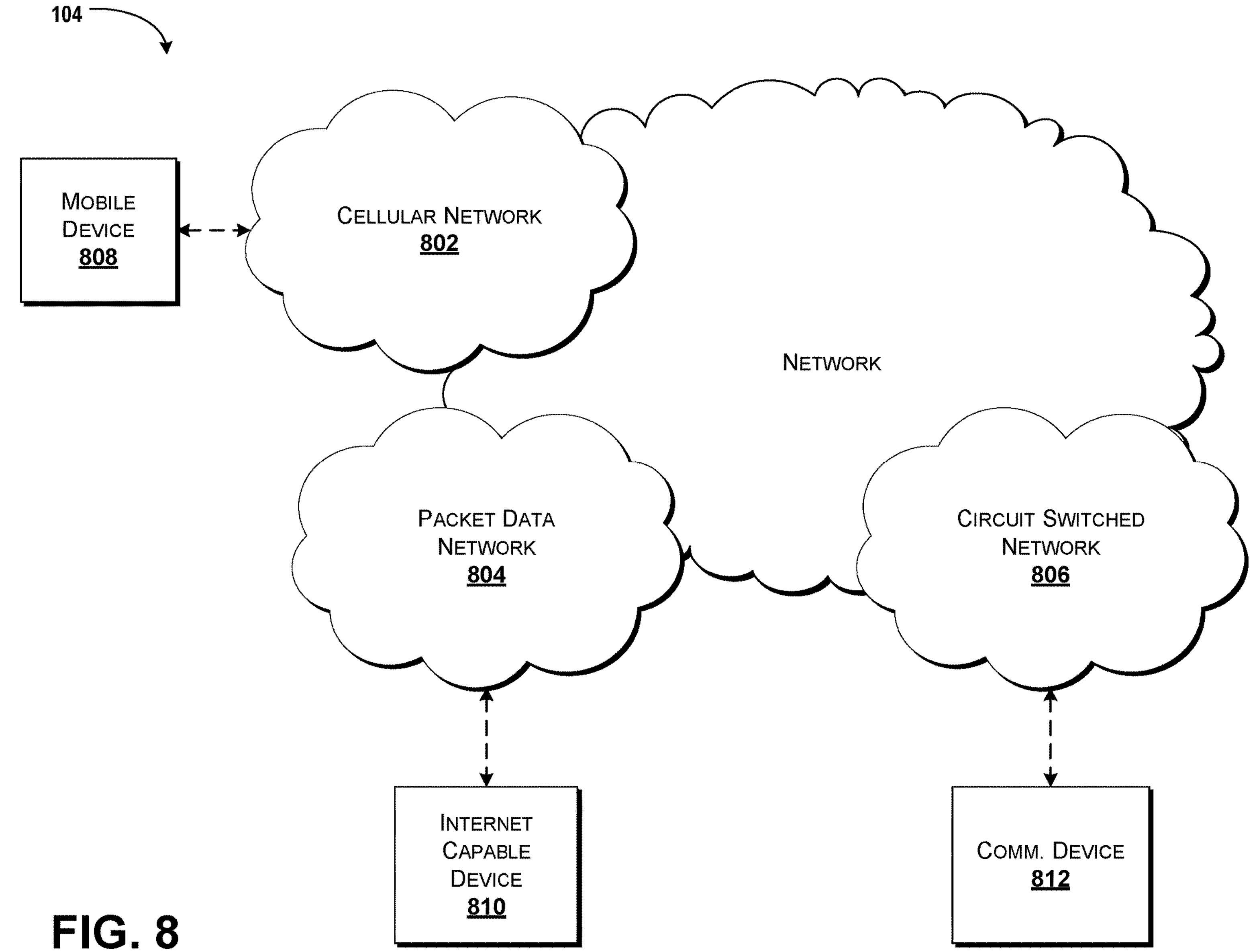
FIG. 8 schematically illustrates a network, according to an illustrative embodiment of the concepts and technologies described herein.

Turning now to FIG. 8, additional details of the network 104 are illustrated, according to an illustrative embodiment. The network 104 includes a cellular network 802, a packet data network 804, for example, the Internet, and a circuit switched network 806, for example, a publicly switched telephone network ("PSTN"). The cellular network 802 includes various components such as, but not limited to, base transceiver stations ("BTSs"), NodeB's or eNodeB's ("eNBs"), gNodeBs ("gNBs"), or the like; base station controllers ("BSCs") radio network controllers ("RNCs"), or the like; an evolved packet core ("EPC"); mobile switching centers ("MSCs" or "MSSs"); session management functions ("SMFs); mobile management entities ("MMEs"); access and mobility management functions ("AMFs); authentication server functions ("AUSFs"), network slice selection functions ("NSSFs); network exposure functions ("NEFs"); policy control functions ("PCFs"); and various other functions in the user and control planes such as, for example, user plane functions ("UPFs), application functions ("AFs"), NF repository functions ("NRFs"), and the like; short message service centers ("SMSCs"); multimedia messaging service centers ("MMSCs"); home location registers ("HLRs"); home subscriber servers ("HSSs"); visitor location registers ("VLRs"); charging platforms; billing platforms; voicemail platforms; GPRS core network components; links to data networks ("DNs") and/or other operator services, third party services, and/or the Internet; location service nodes, an IP Multimedia Subsystem ("IMS"); and the like. Of course, the cellular network 802 also can include various interfaces between various components, as is generally understood. The cellular network 802 also includes radios and nodes for receiving and transmitting voice, data, and combinations thereof to and from radio transceivers, networks, the packet data network 804, and the circuit switched network 806.

A mobile communications device 808, such as, for example, a cellular telephone, a user equipment, a mobile terminal, a PDA, a laptop computer, a hand-held computer, and combinations thereof, can be operatively connected to the cellular network 802. The cellular network 802 can be configured as a 2G GSM network and can provide data communications via GPRS and/or EDGE. Additionally, or alternatively, the cellular network 802 can be configured as a 3G UMTS network and can provide data communications via the HSPA protocol family, for example, HSDPA, EUL (also referred to as HSUPA), and HSPA+. The cellular network 802 also is compatible with 4G mobile communications standards, 5G mobile communications standards, 6G mobile communication standards, other mobile communications standards, and evolved and future mobile communications standards.

The packet data network 804 includes various devices, for example, servers, computers, databases, and other devices in communication with one another, as is generally known. The packet data network 804 devices are accessible via one or more network links. The servers often store various files that are provided to a requesting device such as, for example, a computer, a terminal, a smartphone, or the like. Typically, the requesting device includes software (a "browser") for executing a web page in a format readable by the browser or other software. Other files and/or data may be accessible via "links" in the retrieved files, as is generally known. In some embodiments, the packet data network 804 includes or is in communication with the Internet. The circuit switched network 806 includes various hardware and software for providing circuit switched communications. The circuit switched network 806 may include, or may be, what is often referred to as a plain old telephone system (POTS). The functionality of a circuit switched network 806 or other circuit-switched network are generally known and will not be described herein in detail.

The illustrated cellular network 802 is shown in communication with the packet data network 804 and a circuit switched network 806, though it should be appreciated that this is not necessarily the case. One or more Internet-capable devices 810, for example, a PC, a laptop, a portable device, or another suitable device, can communicate with one or more cellular networks 802, and devices connected thereto, through the packet data network 804. It also should be appreciated that the Internet-capable device 810 can communicate with the packet data network 804 through the circuit switched network 806, the cellular network 802, and/or via other networks (not illustrated).

As illustrated, a communications device 812, for example, a telephone, facsimile machine, modem, computer, or the like, can be in communication with the circuit switched network 806, and therethrough to the packet data network 804 and/or the cellular network 802. It should be appreciated that the communications device 812 can be an Internet-capable device, and can be substantially similar to the Internet-capable device 810. In the specification, the network 104 is used to refer broadly to any combination of the networks 802, 804, 806. It should be appreciated that substantially all of the functionality described with reference to the network 104 can be performed by the cellular network 802, the packet data network 804, and/or the circuit switched network 806, alone or in combination with other networks, network elements, and the like.

Figure 9:
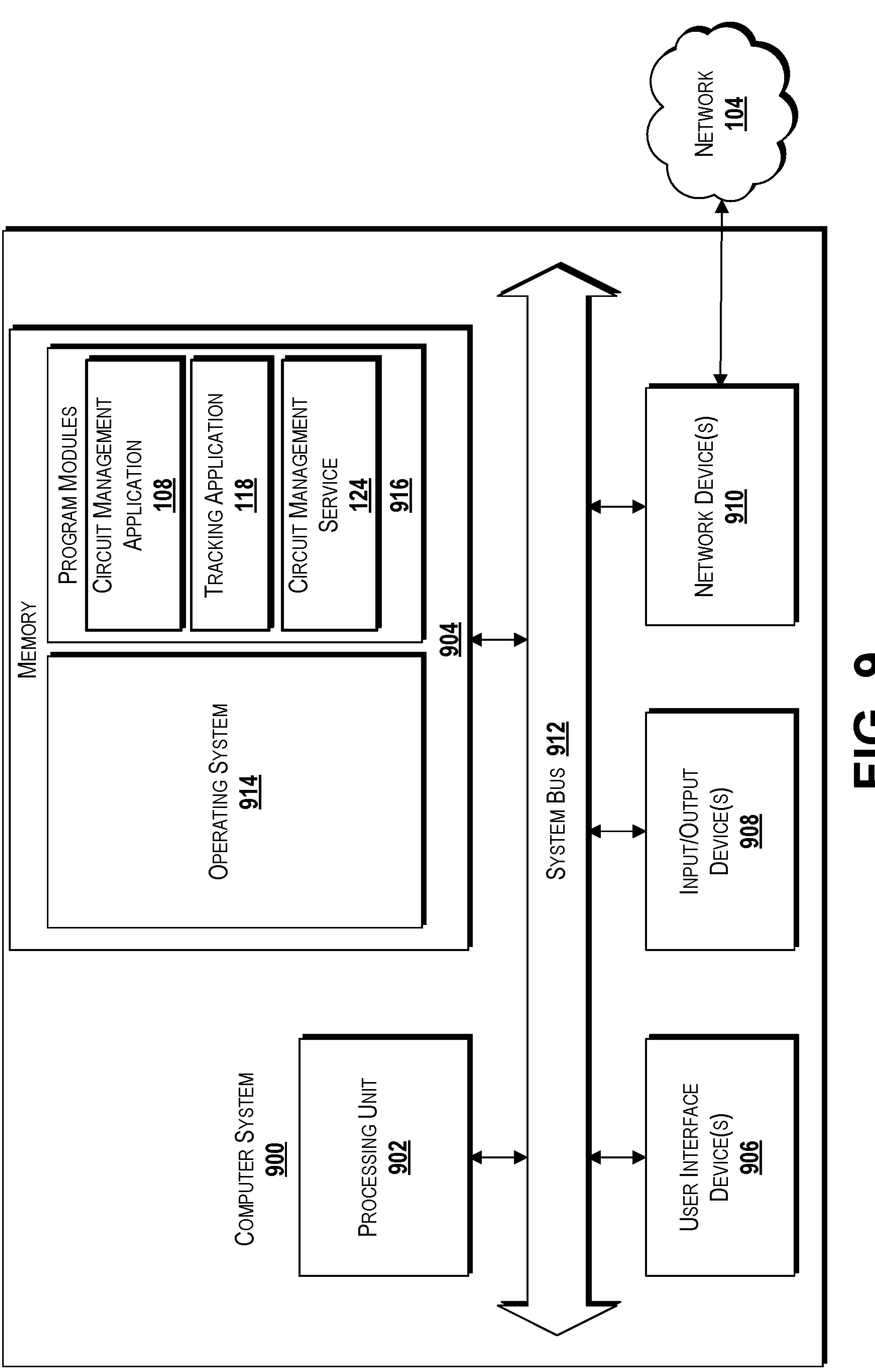
FIG. 9 is a block diagram illustrating an example computer system configured to provide circuit management using a circuit management service, according to some illustrative embodiments of the concepts and technologies described herein.

FIG. 9 is a block diagram illustrating a computer system 900 configured to provide the functionality described herein for circuit management using a circuit management service, in accordance with various embodiments of the concepts and technologies disclosed herein. The computer system 900 includes a processing unit 902, a memory 904, one or more user interface devices 906, one or more input/output ("I/O") devices 908, and one or more network devices 910, each of which is operatively connected to a system bus 912. The system bus 912 can enable bi-directional communication between the processing unit 902, the memory 904, the user interface devices 906, the I/O devices 908, and the network devices 910.

The processing unit 902 may be a standard central processor that performs arithmetic and logical operations, a more specific purpose programmable logic controller ("PLC"), a programmable gate array, or other type of processor known to those skilled in the art and suitable for controlling the operation of the server computer. As used herein, the word "processor" and/or the phrase "processing unit" when used with regard to any architecture or system can include multiple processors or processing units distributed across and/or operating in parallel in a single machine or in multiple machines. Furthermore, processors and/or processing units can be used to support virtual processing environments. Processors and processing units also can include state machines, application-specific integrated circuits ("ASICs"), combinations thereof, or the like. Because processors and/or processing units are generally known, the processors and processing units disclosed herein will not be described in further detail herein.

The memory 904 communicates with the processing unit 902 via the system bus 912. In some embodiments, the memory 904 is operatively connected to a memory controller (not shown) that enables communication with the processing unit 902 via the system bus 912. The memory 904 includes an operating system 914 and one or more program modules 916. The operating system 914 can include, but is not limited to, members of the WINDOWS, WINDOWS CE, and/or WINDOWS MOBILE families of operating systems from MICROSOFT CORPORATION, the LINUX family of operating systems, the SYMBIAN family of operating systems from SYMBIAN LIMITED, the BREW family of operating systems from QUALCOMM CORPORATION, the MAC OS, iOS, and/or SONOMA families of operating systems from APPLE CORPORATION, the FREEBSD family of operating systems, the SOLARIS family of operating systems from ORACLE CORPORATION, other operating systems, and the like.

The program modules 916 may include various software and/or program modules described herein. In some embodiments, for example, the program modules 916 can include the circuit management application 108, the tracking application 118, the circuit management service 124, and/or other applications and/or modules. These and/or other programs can be embodied in computer-readable media containing instructions that, when executed by the processing unit 902, perform one or more of the methods 400A, 400B, 500, 600, and/or 700 described in detail above with respect to FIGS. 4A-7 and/or other functionality as illustrated and described herein. It can be appreciated that, at least by virtue of the instructions embodying the methods 400, 500, 600, 700, and/or other functionality illustrated and described herein being stored in the memory 904 and/or accessed and/or executed by the processing unit 902, the computer system 900 is a special-purpose computing system that can facilitate providing the functionality illustrated and described herein. According to embodiments, the program modules 916 may be embodied in hardware, software, firmware, or any combination thereof. Although not shown in FIG. 9, it should be understood that the memory 904 also can be configured to store the circuit build data 122, the circuit data 128, the circuit request 132, the circuit management data 134, and/or other data, if desired.

By way of example, and not limitation, computer-readable media may include any available computer storage media or communication media that can be accessed by the computer system 900. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Computer storage media includes only non-transitory embodiments of computer readable media as illustrated and described herein. Thus, computer storage media can include volatile and non-volatile, removable and non-removable media implemented in any method or technology for storage of information such as computer-readable instructions, data structures, program modules, or other data. Computer storage media includes, but is not limited to, RAM, ROM, Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium which can be used to store the desired information and which can be accessed by the computer system 900. In the claims, the phrase "computer storage medium" and variations thereof does not include waves or signals per se and/or communication media.

The user interface devices 906 may include one or more devices with which a user accesses the computer system 900. The user interface devices 906 may include, but are not limited to, computers, servers, personal digital assistants, cellular phones, or any suitable computing devices. The I/O devices 908 enable a user to interface with the program modules 916. In one embodiment, the I/O devices 908 are operatively connected to an I/O controller (not shown) that enables communication with the processing unit 902 via the system bus 912. The I/O devices 908 may include one or more input devices, such as, but not limited to, a keyboard, a mouse, or an electronic stylus. Further, the I/O devices 908 may include one or more output devices, such as, but not limited to, a display screen or a printer.

The network devices 910 enable the computer system 900 to communicate with other networks or remote systems via a network, such as the network 104. Examples of the network devices 910 include, but are not limited to, a modem, a radio frequency ("RF") or infrared ("IR") transceiver, a telephonic interface, a bridge, a router, or a network card. The network 104 may include a wireless network such as, but not limited to, a Wireless Local Area Network ("WLAN") such as a WI-FI network, a Wireless Wide Area Network ("WWAN"), a Wireless Personal Area Network ("WPAN") such as BLUETOOTH, a Wireless Metropolitan Area Network ("WMAN") such as a WiMAX network, or a cellular network. Alternatively, the network 104 may be a wired network such as, but not limited to, a Wide Area Network ("WAN") such as the Internet, a Local Area Network ("LAN") such as the Ethernet, a wired Personal Area Network ("PAN"), or a wired Metropolitan Area Network ("MAN").

Figure 10:
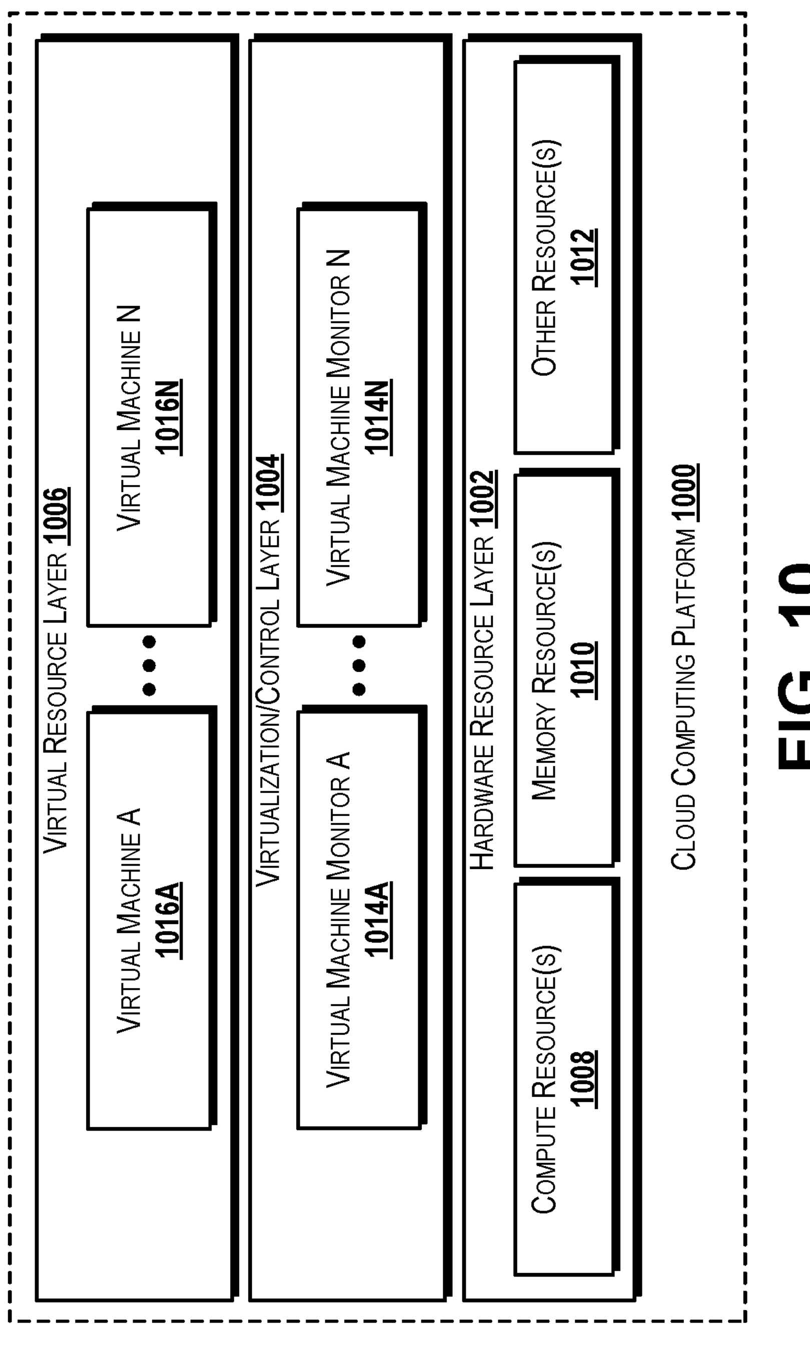
FIG. 10 is a diagram illustrating a computing environment capable of implementing aspects of the concepts and technologies disclosed herein, according to some illustrative embodiments of the concepts and technologies described herein.

FIG. 10 illustrates an illustrative architecture for a cloud computing platform 1000 that can be capable of executing the software components described herein for providing circuit management and/or for interacting with the circuit management service 124. Thus, it can be appreciated that in some embodiments of the concepts and technologies disclosed herein, the cloud computing platform 1000 illustrated in FIG. 10 can be used to provide the functionality described herein with respect to the endpoint devices 102, the user device 120, the server computer 126, the circuit data repository 130, and/or other devices.

The cloud computing platform 1000 thus may be utilized to execute any aspects of the software components presented herein. Thus, according to various embodiments of the concepts and technologies disclosed herein, the circuit management application 108 and/or the circuit management service 124 can be implemented, at least in part, on or by elements included in the cloud computing platform 1000 illustrated and described herein. Those skilled in the art will appreciate that the illustrated cloud computing platform 1000 is a simplification of but only one possible implementation of an illustrative cloud computing platform, and as such, the illustrated cloud computing platform 1000 should not be construed as being limiting in any way.

In the illustrated embodiment, the cloud computing platform 1000 can include a hardware resource layer 1002, a virtualization/control layer 1004, and a virtual resource layer 1006. These layers and/or other layers can be configured to cooperate with each other and/or other elements of a cloud computing platform 1000 to perform operations as will be described in detail herein. While connections are shown between some of the components illustrated in FIG. 10, it should be understood that some, none, or all of the components illustrated in FIG. 10 can be configured to interact with one another to carry out various functions described herein. In some embodiments, the components are arranged so as to communicate via one or more networks such as, for example, the network 104 illustrated and described hereinabove (not shown in FIG. 10). Thus, it should be understood that FIG. 10 and the following description are intended to provide a general understanding of a suitable environment in which various aspects of embodiments can be implemented, and should not be construed as being limiting in any way.

The hardware resource layer 1002 can provide hardware resources. In the illustrated embodiment, the hardware resources can include one or more compute resources 1008, one or more memory resources 1010, and one or more other resources 1012. The compute resource(s) 1008 can include one or more hardware components that can perform computations to process data, and/or to execute computer-executable instructions of one or more application programs, operating systems, services, and/or other software including, but not limited to, the circuit management application 108, the tracking application 118, and/or the circuit management service 124 illustrated and described herein.

According to various embodiments, the compute resources 1008 can include one or more central processing units ("CPUs"). The CPUs can be configured with one or more processing cores. In some embodiments, the compute resources 1008 can include one or more graphics processing units ("GPUs"). The GPUs can be configured to accelerate operations performed by one or more CPUs, and/or to perform computations to process data, and/or to execute computer-executable instructions of one or more application programs, operating systems, and/or other software that may or may not include instructions that are specifically graphics computations and/or related to graphics computations. In some embodiments, the compute resources 1008 can include one or more discrete GPUs. In some other embodiments, the compute resources 1008 can include one or more CPU and/or GPU components that can be configured in accordance with a co-processing CPU/GPU computing model. Thus, it can be appreciated that in some embodiments of the compute resources 1008, a sequential part of an application can execute on a CPU and a computationally-intensive part of the application can be accelerated by the GPU. It should be understood that this example is illustrative, and therefore should not be construed as being limiting in any way.

In some embodiments, the compute resources 1008 also can include one or more system on a chip ("SoC") components. It should be understood that an SoC component can operate in association with one or more other components as illustrated and described herein, for example, one or more of the memory resources 1010 and/or one or more of the other resources 1012. In some embodiments in which an SoC component is included, the compute resources 1008 can be or can include one or more embodiments of the SNAPDRAGON brand family of SoCs, available from QUALCOMM of San Diego, California; one or more embodiment of the TEGRA brand family of SoCs, available from NVIDIA of Santa Clara, California; one or more embodiment of the HUMMINGBIRD brand family of SoCs, available from SAMSUNG of Seoul, South Korea; one or more embodiment of the Open Multimedia Application Platform ("OMAP") family of SoCs, available from TEXAS INSTRUMENTS of Dallas, Texas; one or more customized versions of any of the above SoCs; and/or one or more other brand and/or one or more proprietary SoCs.

The compute resources 1008 can be or can include one or more hardware components arranged in accordance with an ARM architecture, available for license from ARM HOLDINGS of Cambridge, United Kingdom. Alternatively, the compute resources 1008 can be or can include one or more hardware components arranged in accordance with an x86 architecture, such as an architecture available from INTEL CORPORATION of Mountain View, California, and others. Those skilled in the art will appreciate the implementation of the compute resources 1008 can utilize various computation architectures and/or processing architectures. As such, the various example embodiments of the compute resources 1008 as mentioned hereinabove should not be construed as being limiting in any way. Rather, implementations of embodiments of the concepts and technologies disclosed herein can be implemented using compute resources 1008 having any of the particular computation architecture and/or combination of computation architectures mentioned herein as well as other architectures.

Although not separately illustrated in FIG. 10, it should be understood that the compute resources 1008 illustrated and described herein can host and/or execute various services, applications, portals, and/or other functionality illustrated and described herein. Thus, the compute resources 1008 can host and/or can execute the circuit management application 108, the tracking application 118, the circuit management service 124, and/or other applications or services illustrated and described herein.

The memory resource(s) 1010 can include one or more hardware components that can perform or provide storage operations, including temporary and/or permanent storage operations. In some embodiments, the memory resource(s) 1010 can include volatile and/or non-volatile memory implemented in any method or technology for storage of information such as computer-readable instructions, data structures, program modules, or other data disclosed herein. Computer storage media is defined hereinabove and therefore should be understood as including, in various embodiments, random access memory ("RAM"), read-only memory ("ROM"), Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium that can be used to store data and that can be accessed by the compute resources 1008, subject to the definition of "computer storage media" provided above (e.g., as excluding waves and signals per se and/or communication media as defined in this application).

Although not illustrated in FIG. 10, it should be understood that the memory resources 1010 can host or store the various data illustrated and described herein including, but not limited to, circuit build data 122, the circuit data 128, the circuit request 132, the circuit management data 134, and/or other data, if desired. It should be understood that this example is illustrative, and therefore should not be construed as being limiting in any way.

The other resource(s) 1012 can include any other hardware resources that can be utilized by the compute resources(s) 1008 and/or the memory resource(s) 1010 to perform operations. The other resource(s) 1012 can include one or more input and/or output processors (e.g., a network interface controller and/or a wireless radio), one or more modems, one or more codec chipsets, one or more pipeline processors, one or more fast Fourier transform ("FFT") processors, one or more digital signal processors ("DSPs"), one or more speech synthesizers, combinations thereof, or the like.

The hardware resources operating within the hardware resource layer 1002 can be virtualized by one or more virtual machine monitors ("VMMs") 1014A-1014N (also known as "hypervisors;" hereinafter "VMMs 1014"). The VMMs 1014 can operate within the virtualization/control layer 1004 to manage one or more virtual resources that can reside in the virtual resource layer 1006. The VMMs 1014 can be or can include software, firmware, and/or hardware that alone or in combination with other software, firmware, and/or hardware, can manage one or more virtual resources operating within the virtual resource layer 1006.

The virtual resources operating within the virtual resource layer 1006 can include abstractions of at least a portion of the compute resources 1008, the memory resources 1010, the other resources 1012, or any combination thereof. These abstractions are referred to herein as virtual machines ("VMs"). In the illustrated embodiment, the virtual resource layer 1006 includes VMs 1016A-1016N (hereinafter "VMs 1016").

Based on the foregoing, it should be appreciated that systems and methods for providing circuit management using a circuit management service have been disclosed herein. Although the subject matter presented herein has been described in language specific to computer structural features, methodological and transformative acts, specific computing machinery, and computer-readable media, it is to be understood that the concepts and technologies disclosed herein are not necessarily limited to the specific features, acts, or media described herein. Rather, the specific features, acts and mediums are disclosed as example forms of implementing the concepts and technologies disclosed herein.

The subject matter described above is provided by way of illustration only and should not be construed as limiting. Various modifications and changes may be made to the subject matter described herein without following the example embodiments and applications illustrated and described, and without departing from the true spirit and scope of the embodiments of the concepts and technologies disclosed herein.

The invention claimed is:

1. A device comprising a processor and a memory that stores computer-executable instructions that, when executed by the processor, cause the processor to perform operations comprising:

sending, by a user device and directed to a circuit management service hosted by a server computer, a circuit request that comprises a request for circuit management data that relates to a circuit associated with an installation site, wherein the circuit comprises a first endpoint device and a second endpoint device;

receiving, by the user device and from the circuit management service, the circuit management data, wherein the circuit management data comprises a circuit identifier and data that identifies the first endpoint device and the second endpoint device and location information associated with the first endpoint device and the second endpoint device;

presenting, at the user device, a user interface that comprises circuit information that identifies the first endpoint device, a first location associated with the first endpoint device, the second endpoint device, a second location associated with the second endpoint device, and an option to propagate the circuit information to the first endpoint device and to the second endpoint device; and in response to detecting selection of the option to propagate the circuit information to the first endpoint device and to the second endpoint device, sending, by the user device, a request to the circuit management service to propagate the circuit information to the first endpoint device and to the second endpoint device, wherein the user device interacts with the circuit management service to create circuit data that describes the circuit when the circuit is created, wherein the circuit management service generates the circuit management data based on the circuit data, and wherein the circuit data comprises the circuit identifier that uniquely identifies the circuit, a circuit description that describes a purpose and function of the circuit, and endpoint locations associated with the first endpoint device and the second endpoint device.

2. The device of claim 1, wherein the first endpoint device comprises a first display, wherein the first endpoint device is configured to present a first portion of the circuit information on the first display, the first portion of the circuit information comprising an identity of the second endpoint device and the second location associated with the second endpoint device, wherein the second endpoint device comprises a second display, and wherein the second endpoint device is configured to present a second portion of the circuit information on the second display, the second portion of the circuit information comprising an identity of the first endpoint device and the first location associated with the first endpoint device.

3. The device of claim 2, wherein the first location comprises a first room, a first rack, a first rack unit, and a first port, and wherein the second location comprises a second room, a second rack, a second rack unit, and a second port.

4. The device of claim 3, wherein the first portion of the circuit information further comprises an owner associated with the circuit and the circuit identifier, and wherein the second portion of the circuit information further comprises the owner associated with the circuit and the circuit identifier.

5. The device of claim 1, wherein the endpoint locations comprise:

a first port that corresponds to a first endpoint; and
a second port that corresponds to a second endpoint.

6. The device of claim 1, wherein the endpoint locations comprise:

a first geographic location of a first endpoint;
a first port that corresponds to the first endpoint;
a second geographic location of a second endpoint; and
a second port that corresponds to the second endpoint.

7. The device of claim 1, wherein the endpoint locations comprise:

a first geographic location of a first endpoint;
a first room in which the first endpoint is located;
a first server rack in which the first endpoint is located;
a first rack unit in which the first endpoint is located;
a first port that corresponds to the first endpoint;
a second geographic location of a second endpoint;
a second room in which the second endpoint is located;
a second server rack in which the second endpoint is located;
a second rack unit in which the second endpoint is located; and
a second port that corresponds to the second endpoint.

8. A method comprising:

sending, by a user device comprising a processor and directed to a circuit management service hosted by a server computer, a circuit request that comprises a request for circuit management data that relates to a circuit associated with an installation site, wherein the circuit comprises a first endpoint device and a second endpoint device;

receiving, by the user device and from the circuit management service, the circuit management data, wherein the circuit management data comprises a circuit identifier and data that identifies the first endpoint device and the second endpoint device and location information associated with the first endpoint device and the second endpoint device;

presenting, at the user device, a user interface that comprises circuit information that identifies the first endpoint device, a first location associated with the first endpoint device, the second endpoint device, a second location associated with the second endpoint device, and an option to propagate the circuit information to the first endpoint device and to the second endpoint device; and in response to detecting selection of the option to propagate the circuit information to the first endpoint device and to the second endpoint device, sending, by the user device, a request to the circuit management service to propagate the circuit information to the first endpoint device and to the second endpoint device, wherein the user device interacts with the circuit management service to create circuit data that describes the circuit when the circuit is created, wherein the circuit management service generates the circuit management data based on the circuit data, and wherein the circuit data comprises the circuit identifier that uniquely identifies the circuit, a circuit description that describes a purpose and function of the circuit, and endpoint locations associated with the first endpoint device and the second endpoint device.

9. The method of claim 8, wherein the first endpoint device comprises a first display, wherein the first endpoint device is configured to present a first portion of the circuit information on the first display, the first portion of the circuit information comprising an identity of the second endpoint device and the second location associated with the second endpoint device, wherein the second endpoint device comprises a second display, and wherein the second endpoint device is configured to present a second portion of the circuit information on the second display, the second portion of the circuit information comprising an identity of the first endpoint device and the first location associated with the first endpoint device.

10. The method of claim 9, wherein the first location comprises a first room, a first rack, a first rack unit, and a first port, wherein the second location comprises a second room, a second rack, a second rack unit, and a second port, wherein the first portion of the circuit information further comprises an owner associated with the circuit and the circuit identifier, and wherein the second portion of the circuit information further comprises the owner associated with the circuit and the circuit identifier.

11. The method of claim 8, wherein the endpoint locations comprise:

a first port that corresponds to a first endpoint; and a second port that corresponds to a second endpoint.

12. The method of claim 8, wherein the endpoint locations comprise:

a first geographic location of a first endpoint;

a first port that corresponds to the first endpoint;

a second geographic location of a second endpoint; and a second port that corresponds to the second endpoint.

13. The method of claim 8, wherein the endpoint locations comprise:

a first geographic location of a first endpoint;

a first room in which the first endpoint is located;

a first server rack in which the first endpoint is located;

a first rack unit in which the first endpoint is located;

a first port that corresponds to the first endpoint;

a second geographic location of a second endpoint;

a second room in which the second endpoint is located;

a second server rack in which the second endpoint is located;

a second rack unit in which the second endpoint is located; and a second port that corresponds to the second endpoint.

14. A computer storage medium having computer-executable instructions stored thereon that, when executed by a processor, cause the processor to perform operations comprising:

sending, by a user device and directed to a circuit management service hosted by a server computer, a circuit request that comprises a request for circuit management data that relates to a circuit associated with an installation site, wherein the circuit comprises a first endpoint device and a second endpoint device;

receiving, by the user device and from the circuit management service, the circuit management data, wherein the circuit management data comprises a circuit identifier and data that identifies the first endpoint device and the second endpoint device and location information associated with the first endpoint device and the second endpoint device;

presenting, at the user device, a user interface that comprises circuit information that identifies the first endpoint device, a first location associated with the first endpoint device, the second endpoint device, a second location associated with the second endpoint device, and an option to propagate the circuit information to the first endpoint device and to the second endpoint device; and in response to detecting selection of the option to propagate the circuit information to the first endpoint device and to the second endpoint device, sending, by the user device, a request to the circuit management service to propagate the circuit information to the first endpoint device and to the second endpoint device, wherein the user device interacts with the circuit management service to create circuit data that describes the circuit when the circuit is created, wherein the circuit management service generates the circuit management data based on the circuit data, and wherein the circuit data comprises the circuit identifier that uniquely identifies the circuit, a circuit description that describes a purpose and function of the circuit, and endpoint locations associated with the first endpoint device and the second endpoint device.

15. The computer storage medium of claim 14, wherein the first endpoint device comprises a first display, wherein the first endpoint device is configured to present a first portion of the circuit information on the first display, the first portion of the circuit information comprising an identity of the second endpoint device and the second location associated with the second endpoint device, wherein the second endpoint device comprises a second display, and wherein the second endpoint device is configured to present a second portion of the circuit information on the second display, the second portion of the circuit information comprising an identity of the first endpoint device and the first location associated with the first endpoint device.

16. The computer storage medium of claim 15, wherein the first location comprises a first room, a first rack, a first rack unit, and a first port, and wherein the second location comprises a second room, a second rack, a second rack unit, and a second port.

17. The computer storage medium of claim 16, wherein the first portion of the circuit information further comprises an owner associated with the circuit and the circuit identifier, and wherein the second portion of the circuit information further comprises the owner associated with the circuit and the circuit identifier.

18. The computer storage medium of claim 14, wherein the endpoint locations comprise:

a first port that corresponds to a first endpoint; and a second port that corresponds to a second endpoint.

19. The computer storage medium of claim 14, wherein the endpoint locations comprise:

a first geographic location of a first endpoint;

a first port that corresponds to the first endpoint;

a second geographic location of a second endpoint; and a second port that corresponds to the second endpoint.

20. The computer storage medium of claim 14, wherein the endpoint locations comprise:

a first geographic location of a first endpoint;

a first room in which the first endpoint is located;

a first server rack in which the first endpoint is located;

a first rack unit in which the first endpoint is located;

a first port that corresponds to the first endpoint;

a second geographic location of a second endpoint;

a second room in which the second endpoint is located;

a second server rack in which the second endpoint is located;

a second rack unit in which the second endpoint is located; and a second port that corresponds to the second endpoint.

* * * * *